(12) United States Patent
Kimura

(10) Patent No.: US 8,686,934 B2
(45) Date of Patent: Apr. 1, 2014

(54) DISPLAY DEVICE AND ELECTRONIC DEVICE USING THE SAME

(75) Inventor: Hajime Kimura, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 1020 days.

(21) Appl. No.: 11/605,122

(22) Filed: Nov. 28, 2006

(65) Prior Publication Data
US 2007/0126685 A1 Jun. 7, 2007

(30) Foreign Application Priority Data
Dec. 2, 2005 (JP) .................. 2005-349889

(51) Int. Cl.
G09G 3/36 (2006.01)

(52) U.S. Cl.
USPC .................. 345/96; 345/209; 345/87

(58) Field of Classification Search
USPC .................... 345/87–104
See application file for complete search history.

(56) References Cited

U.S. PATENT DOCUMENTS

| | | | |
|---|---|---|---|
| 4,345,249 A | 8/1982 | Togashi | |
| 4,393,380 A | 7/1983 | Hosokawa et al. | |
| 5,296,847 A | 3/1994 | Takeda et al. | |
| 5,448,384 A | 9/1995 | Uchino et al. | |
| 5,526,012 A | 6/1996 | Shibahara | |
| 5,537,129 A | 7/1996 | Okada et al. | |
| 5,581,273 A * | 12/1996 | Yoneda et al. | 345/90 |
| 5,598,285 A | 1/1997 | Kondo et al. | |
| 5,737,051 A | 4/1998 | Kondo et al. | |
| 5,793,346 A | 8/1998 | Moon | |
| 5,847,687 A | 12/1998 | Hirakata et al. | |
| 5,867,139 A | 2/1999 | Tanaka et al. | |
| 5,903,249 A | 5/1999 | Koyama et al. | |
| 5,926,161 A | 7/1999 | Furuhashi et al. | |
| 5,926,162 A | 7/1999 | Wood et al. | |
| 5,945,970 A | 8/1999 | Moon et al. | |

(Continued)

FOREIGN PATENT DOCUMENTS

| | | |
|---|---|---|
| EP | 0 631 271 A1 | 12/1994 |
| EP | 0 917 128 A1 | 5/1999 |

(Continued)

OTHER PUBLICATIONS

European Search Report re application No. EP 06023936.5, dated Feb. 5, 2008.

(Continued)

*Primary Examiner* — Sumati Lefkowitz
*Assistant Examiner* — Jose Soto Lopez
(74) *Attorney, Agent, or Firm* — Husch Blackwell LLP

(57) ABSTRACT

The present invention reduces power consumption of a display device. The display device includes a wire to which a video signal is input, a first capacitor element and a second capacitor element which are connected to the wire in parallel, and a pixel. Between the first capacitor element and the wire, a first switch is provided so as to control conduction and non conduction between the first capacitor element and the wire. Between the second capacitor element and the wire, a second switch is provided so as to control conduction and non conduction between the second capacitor element and the wire. The pixel and the wire are arranged such that the pixel and the wire can be connected to each other, and a video signal can be input to the pixel.

28 Claims, 27 Drawing Sheets

(56) References Cited

U.S. PATENT DOCUMENTS

| | | | |
|---|---|---|---|
| 5,959,599 | A | 9/1999 | Hirakata |
| 5,977,562 | A | 11/1999 | Hirakata et al. |
| 6,005,542 | A | 12/1999 | Yoon |
| 6,031,514 | A | 2/2000 | Hashimoto et al. |
| 6,388,511 | B1* | 5/2002 | Kanao ................... 327/558 |
| 6,628,253 | B1 | 9/2003 | Hiroki |
| 6,872,973 | B1 | 3/2005 | Koyama et al. |
| 6,911,962 | B1 | 6/2005 | Hirakata et al. |
| 7,084,847 | B2 | 8/2006 | Kageyama et al. |
| 7,084,852 | B2 | 8/2006 | Nishi et al. |
| 7,151,516 | B2 | 12/2006 | Takeda et al. |
| 7,236,149 | B2 | 6/2007 | Yamashita et al. |
| 7,304,621 | B2 | 12/2007 | Oomori et al. |
| 7,355,572 | B2 | 4/2008 | Uchino et al. |
| 7,372,440 | B2 | 5/2008 | Ota et al. |
| 7,656,372 | B2 | 2/2010 | Sato et al. |
| 7,764,260 | B2* | 7/2010 | Nishi et al. ................ 345/98 |
| 7,852,303 | B2 | 12/2010 | Hashimoto |
| 7,852,311 | B2 | 12/2010 | Hashimoto |
| 7,864,171 | B2 | 1/2011 | Oomori et al. |
| 8,035,602 | B2* | 10/2011 | Nishi et al. ................ 345/98 |
| 8,278,660 | B2 | 10/2012 | Zhang et al. |
| 2002/0033786 | A1* | 3/2002 | Akimoto et al. ............ 345/87 |
| 2004/0095304 | A1 | 5/2004 | Hiroki |
| 2004/0178849 | A1* | 9/2004 | Kimura .................... 330/253 |
| 2004/0263507 | A1* | 12/2004 | Sun ......................... 345/212 |
| 2005/0068282 | A1* | 3/2005 | Mizumaki .................. 345/89 |
| 2005/0162356 | A1 | 7/2005 | Koyama et al. |
| 2006/0017679 | A1 | 1/2006 | Hirakata et al. |
| 2006/0103618 | A1* | 5/2006 | Miura ...................... 345/96 |

FOREIGN PATENT DOCUMENTS

| | | |
|---|---|---|
| EP | 1 094 436 A2 | 4/2001 |
| EP | 1 345 203 A1 | 9/2003 |
| EP | 1 624 436 A1 | 2/2006 |
| JP | 10-97222 | 4/1998 |
| JP | 10-222130 | 8/1998 |
| JP | 10-293559 | 11/1998 |
| JP | 11-231822 | 8/1999 |
| JP | 2001-222255 | 8/2001 |
| JP | 2003-271105 | 9/2003 |
| JP | 2004-69848 | 3/2004 |
| JP | 2004-163912 | 6/2004 |
| JP | 2004-354758 | 12/2004 |
| JP | 2005-241778 | 9/2005 |
| JP | 2006-323341 | 11/2006 |
| WO | WO 99/12072 A2 | 3/1999 |

OTHER PUBLICATIONS

EPO Examination Report dated Oct. 9, 2009 for Application No. EP 06023936.5.

* cited by examiner

DISPLAY DEVICE AND ELECTRONIC DEVICE USING THE SAME

BACKGROUND OF THE INVENTION

1. Field of the Invention

The present invention relates to display devices. In particular, the present invention relates to liquid crystal display devices, and further, to a technique for reducing power consumption.

2. Description of the Related Art

EL display devices, plasma displays, liquid crystal display devices, and the like are given as examples of display devices. For example, a liquid crystal display device which is one example of them is driven by inverting a polarity of a voltage to be applied to a pixel electrode with respect to a potential of an opposite electrode (common potential) every certain period, in order to prevent deterioration of a liquid crystal material, reduce display unevenness (mura) such as flickers, keep display quality, and so on. Such driving method is called as inversion driving.

As examples of the inversion driving, frame inversion driving, source line inversion driving, gate line inversion driving, dot inversion driving, common inversion driving, and the like can be given (for example, see Reference 1: Japanese Published Patent Application No. H 11-231822).

Frame inversion driving is a driving method in which a polarity of a voltage to be applied to a pixel electrode is inversed with respect to a common potential every frame period. FIG. 8 shows a display pattern diagram of the frame inversion driving. Note that the display pattern diagram shown in FIG. 8 shows a model screen having display pixels of 3 rows×4 columns as an example for simplification. Since the frame inversion driving has a long inversion period of polarities, flickers are easy to be recognized visibly. In order to reduce flickers, the frame inversion driving and source line inversion driving, gate line inversion driving, dot inversion driving, or the like are combined in general.

The gate line inversion driving is a driving method in which a polarity of a voltage to be applied to each pixel is inverted every gate line. FIG. 9 shows a display pattern diagram of the gate line inversion driving. Note that the display pattern diagram shown in FIG. 9 shows a model screen having display pixels of 3 rows×4 columns as an example for simplification.

The source line inversion driving is a driving method in which a polarity of a voltage to be applied to each pixel is inverted every source line. FIG. 10 shows a display pattern diagram of the source line inversion driving. Note that the display pattern diagram shown in FIG. 10 shows a model screen having display pixels of 3 rows×4 columns as an example for simplification.

The dot inversion driving is a driving method in which a polarity of a voltage to be applied to a pixel electrode is inverted every pixel, and which is made by combining the source line inversion driving and the gate line inversion driving. FIG. 11 shows a display pattern diagram of the dot inversion driving. Note that the display pattern diagram shown in FIG. 11 shows a model screen having display pixels of 3 rows×4 columns as an example for simplification.

In addition, when the frame inversion driving, the source line inversion driving, the gate line inversion driving, the dot inversion driving or the like is adopted, an amplitude width of a potential of a video signal written into a source signal line is needed to be twice as large as that of when inversion driving is not conducted (when driving with only one polarity of a voltage to be applied to a pixel electrode with respect to a common potential.). Thus, as compared with the case where the inversion driving is not conducted (when driving with only one polarity of a voltage to be applied to a pixel electrode with respect to a common potential, i.e., driving without inverting the polarity of a voltage), power consumption becomes high as well as high resistance to voltage of a driver circuit is necessary. Then, in the case of the frame inversion driving or the gate line inversion driving, common inversion driving is further adopted in some cases.

The common inversion driving is a driving method in which a polarity of a common potential is inverted in synchronization with timing of polarity inversion of a potential of a pixel electrode, and an amplitude width of a potential of a video signal written into a source signal line can be reduced by half by the common inversion driving.

There is also a case where inversion driving is conducted for an EL display device for the sake of lengthening a lifetime of an EL element, not only for a liquid crystal display device (for example, see Reference 2: Japanese Published Patent Application No. 2001-222255).

SUMMARY OF THE INVENTION

As described above, when the frame inversion driving, the source line inversion driving, the gate line inversion driving, the dot inversion driving or the like is adopted, an amplitude width of a potential of a video signal written into a source signal line is needed to be twice as large as that of when driving with only one polarity. Thus, as compared with the case where driving is made with one polarity, i.e., driving is conducted without inverting a polarity of a voltage, power consumption becomes high as well as high resistance to voltage of a driver circuit is necessary. Then, even in the case of employing the common inversion driving in addition to the frame inversion driving or the gate line inversion driving in order to solve the problem such as high power consumption, power consumption is larger than the case of driving with one polarity.

As just described, power consumption of the inversion driving is larger than that of driving with one polarity.

In view of the above described problems, it is an object of the present invention to provide display devices whose power consumption is reduced and electronic devices using the display devices.

One feature of the present invention is a display device which is driven by inversion driving, in which a capacitor element storing positive charges and a capacitor element storing negative charges can be connected in parallel to a wire (a source signal line) to be supplied with a video signal, and the positive or negative charges stored in each capacitor element are discharged in turn at the time of conducting inversion driving to be used for charging in a wiring capacity, thereby reducing power consumption.

One feature of the present invention is a display device includes a wire (a source signal line) to which a video signal is input, a first capacitor element and a second capacitor element which are connected to the wire in parallel, and a pixel. Between the first capacitor element and the wire, a first switch is provided so as to control conduction and non conduction between the first capacitor element and the wire. Between the second capacitor element and the wire, a second switch is provided so as to control conduction and non conduction between the second capacitor element and the wire. The pixel and the wire are arranged such that the pixel and the wire can be connected to each other, and a video signal can be input to the pixel.

The first capacitor element has a function of storing positive charges, and the second capacitor element has a function of storing negative charges.

Further, a display device of the present invention is preferably applied to a liquid crystal display device.

A display device of the present invention includes a first capacitor element, a second capacitor element, a first switch, and a second switch. Thus, positive charges are stored in the first capacitor element and negative charges are stored in the second capacitor element at the time of conducting inversion driving, and the stored charges are effectively utilized at the time of conducting inversion between positive charges and negative charges, thereby reducing power consumption.

DETAILED DESCRIPTION OF THE INVENTION

Embodiment Mode

Figure 1:
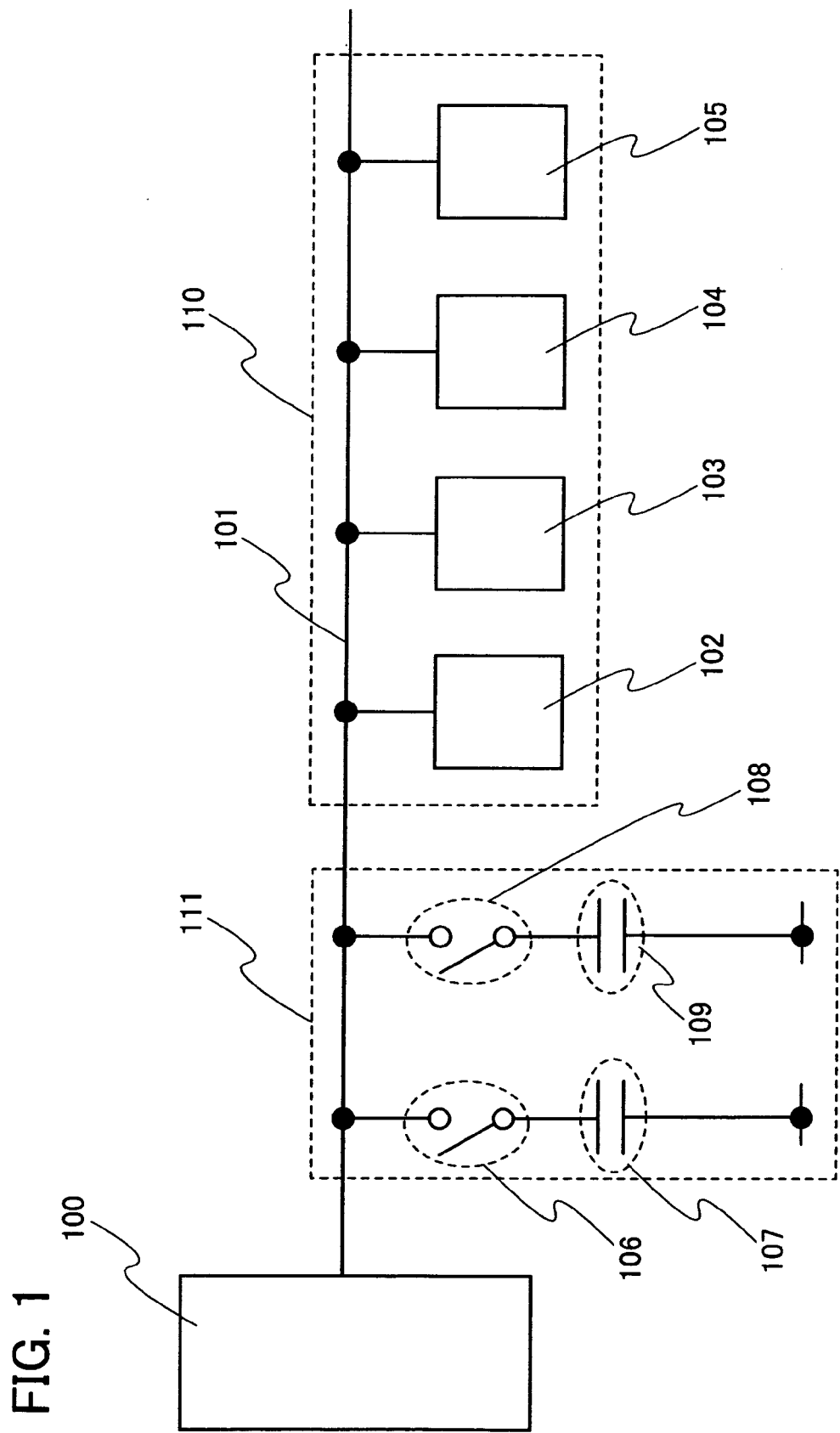
FIG. 1 shows a display device according to an aspect of the present invention.

Embodiment Mode and Embodiments of the present invention will be described with reference to the drawings. The present invention can be carried out in many different modes without being limited to the description given below. It is easily understood by those skilled in the art that modes and details disclosed herein can be modified in various ways without departing from the spirit and the scope of the present invention. It should be noted that the present invention should not be interpreted as being limited to the description of the embodiment mode and embodiments given below.

Embodiment Mode of the present invention will be described with reference to FIG. 1. In a display device of the present invention, one terminal of a first switch 106 and one terminal of a second switch 108 are electrically connected to a source signal line 101. A first electrode of a first capacitor element 107 is electrically connected to the other terminal of the first switch 106, and a first electrode of a second capacitor element 109 is electrically connected to the other terminal of the second switch 108.

A plurality of pixels 102 to 105 are electrically connected to the source signal line 101, and a video signal output from a source signal line driver circuit 100 is written into the plurality of pixels 102 to 105. Note that four pixels are electrically connected to the source signal line 101 here; however, the number of pixels which are electrically connected to the source signal line is not limited to four. In a case of a display device with n rows×m columns, the number of pixels which are electrically connected to one source signal line is n. Note that n and m are natural numbers of 1 or more.

In FIG. 1, in a region 111 which is adjacent to a pixel portion 110 and which is between the source signal line driver circuit 100 and the pixel portion 110, the first capacitor element 107 is electrically connected to the source signal line 101 via the first switch 106, and the second capacitor element 109 is electrically connected to the source signal line 101 via the second switch 108. However, the present invention is not limited to this.

Figure 2:
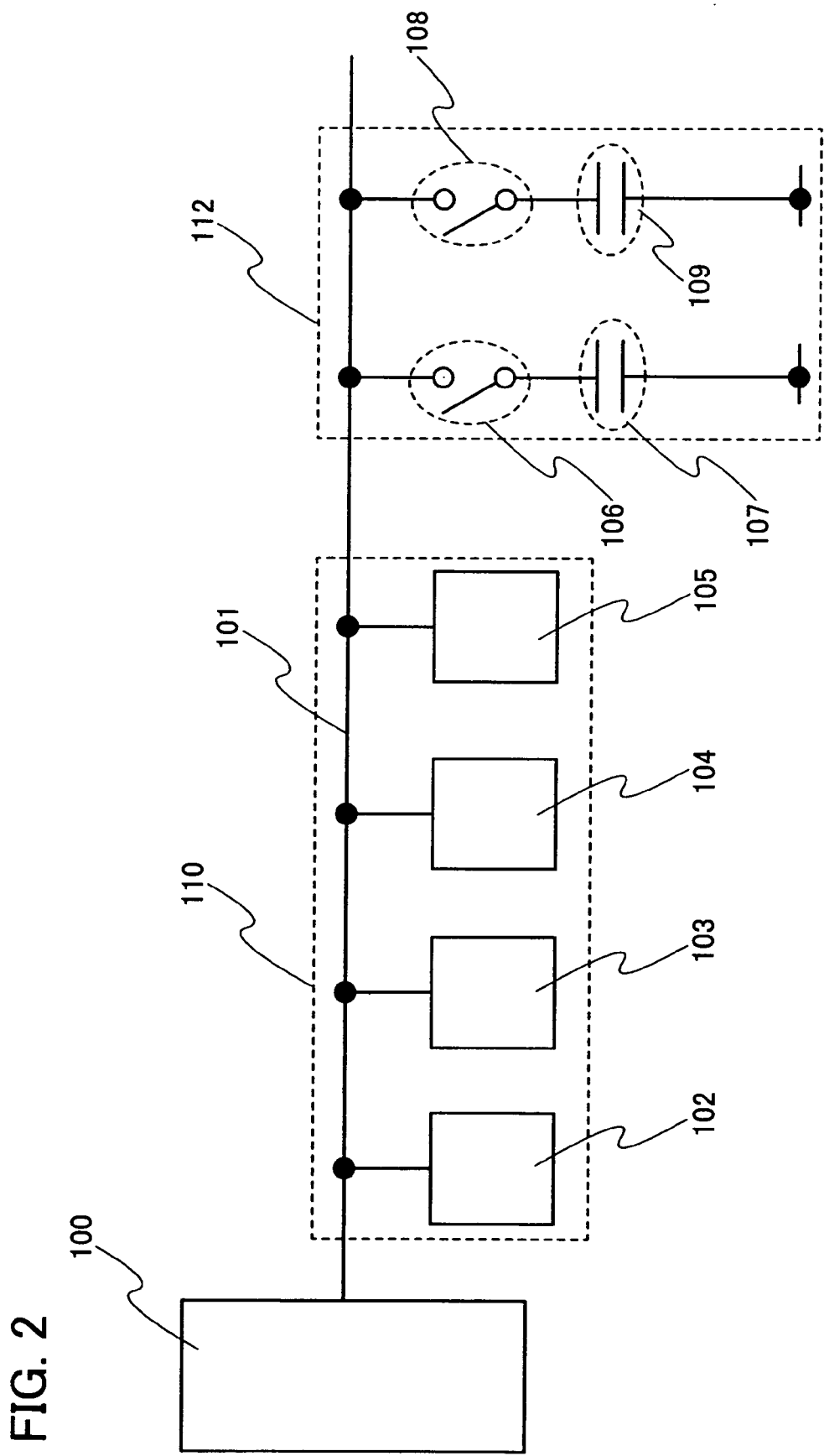
FIG. 2 shows a display device according to an aspect of the present invention.

For example, as shown in FIG. 2, in a region 112 (region which is opposite to the source signal line driver circuit 100 with the pixel portion 110 therebetween) near an end portion of the source signal line 101 which is on a side opposite to the source signal line driver circuit 100, the first capacitor element 107 may be electrically connected to the source signal line 101 via the first switch 106 and the second capacitor element 109 may be electrically connected to the source signal line 101 via the second switch 108.

Figure 3:
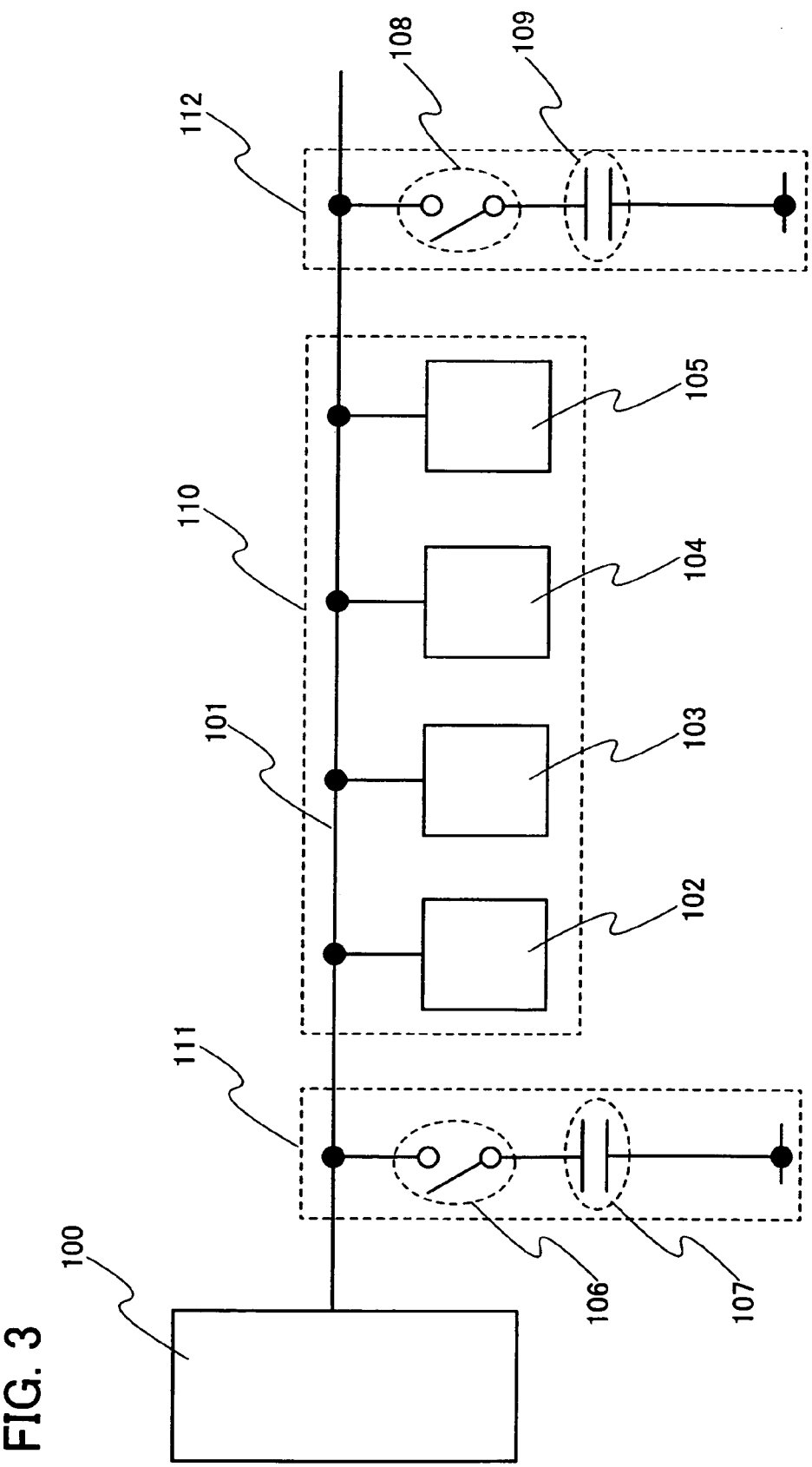
FIG. 3 shows a display device according to an aspect of the present invention.

As shown in FIG. 3, in the region 111 between the source signal line driver circuit 100 and the pixel portion 110, the first capacitor element 107 is electrically connected to the source signal line 101 via the first switch 106, and in the region 112 (region which is opposite to the source signal line driver circuit 100 with the pixel portion 110 therebetween) near the end portion of the source signal line 101 which is on the side opposite to the source signal line driver circuit 100, the second capacitor element 109 may be electrically connected to the source signal line 101 via the second switch 108.

Figure 4:
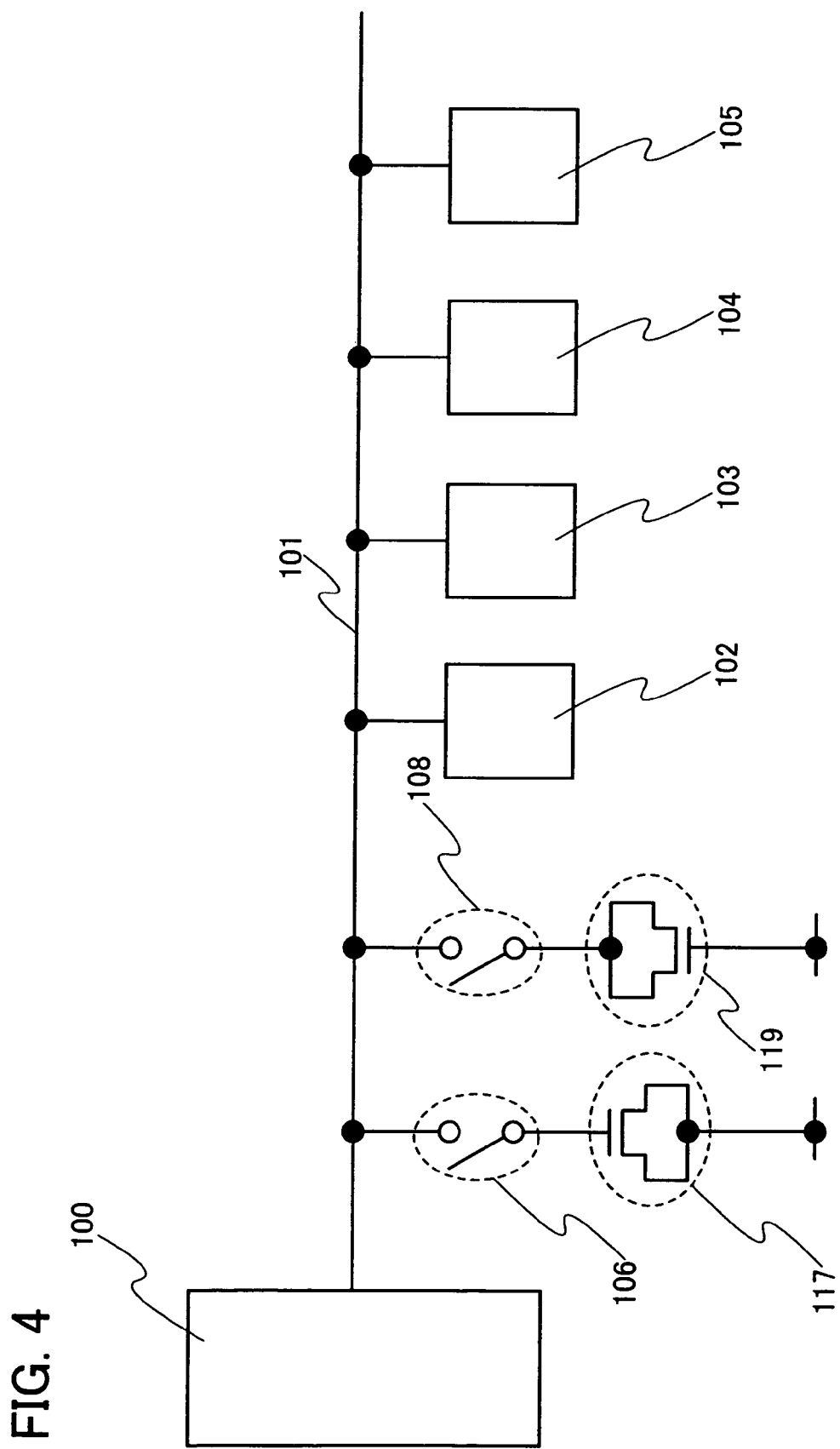
FIG. 4 shows a display device according to an aspect of the present invention.
Figure 12A:
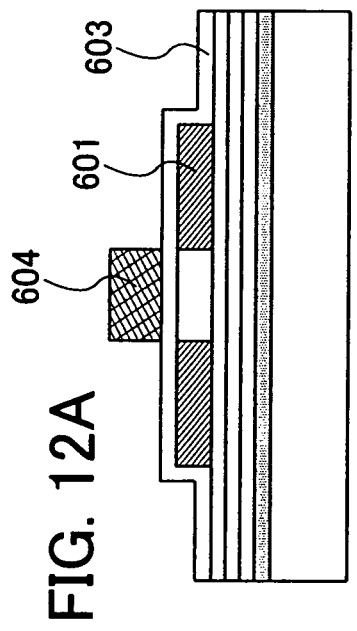
FIGS. 12A to 12C show a capacitor transistor.

Further, as shown in FIG. 4, a first capacitor transistor (transistor used as a capacitor) 117 and a second capacitor transistor 119 may be provided instead of the first capacitor element 107 and the second capacitor element 109. A source electrode and a drain electrode of each of the first capacitor transistor 117 and the second capacitor transistor 119 are electrically connected to each other, and when the first capacitor transistor 117 and the second capacitor transistor 119 are turned ON, a capacitor is formed between a gate electrode and a channel forming region. A cross-sectional structure of a capacitor transistor like this is the same as that of a normal thin film transistor, as shown in FIG. 12A. In FIG. 12A, the capacitor transistor has a gate electrode 604, a gate insulating film 603, and a semiconductor film 601 having the channel forming region.

Figure 12B:
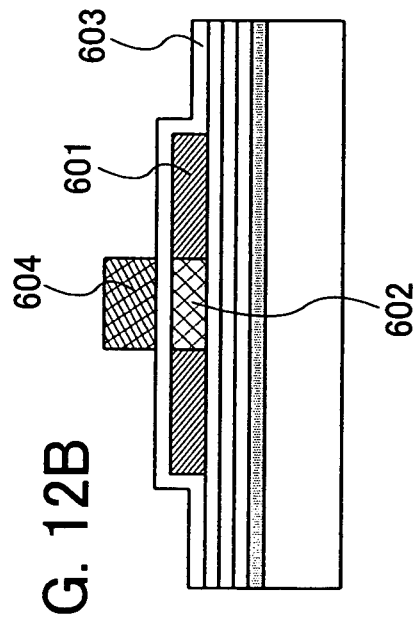
Figure 12C:
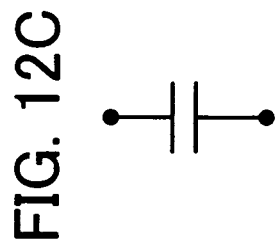

As in the above structure, since the capacitor using a gate insulating film 603 is adversely affected by change of a threshold voltage of a transistor, for example, it cannot serve as the capacitor element, an impurity element may be added to a region 602 which is overlapped with a gate electrode 604 of a semiconductor film 601 (FIG. 12B). In this manner, a capacitor is formed independently of the threshold voltage of the transistor. An equivalent circuit diagram in this case is shown as in FIG. 12C.

FIG. 4 shows a case where the first capacitor transistor 117 and the second capacitor transistor 119 are both N-channel thin film transistors. In this case, since the first capacitor transistor 117 stores positive charges, a gate electrode of the first capacitor transistor 117 is electrically connected to the source signal line 101 via the first switch 106. Since the second capacitor transistor 119 stores negative charges, a source electrode and a drain electrode of the second capacitor transistor 119 are electrically connected to the source signal line 101 via the second switch 108.

Figure 5:
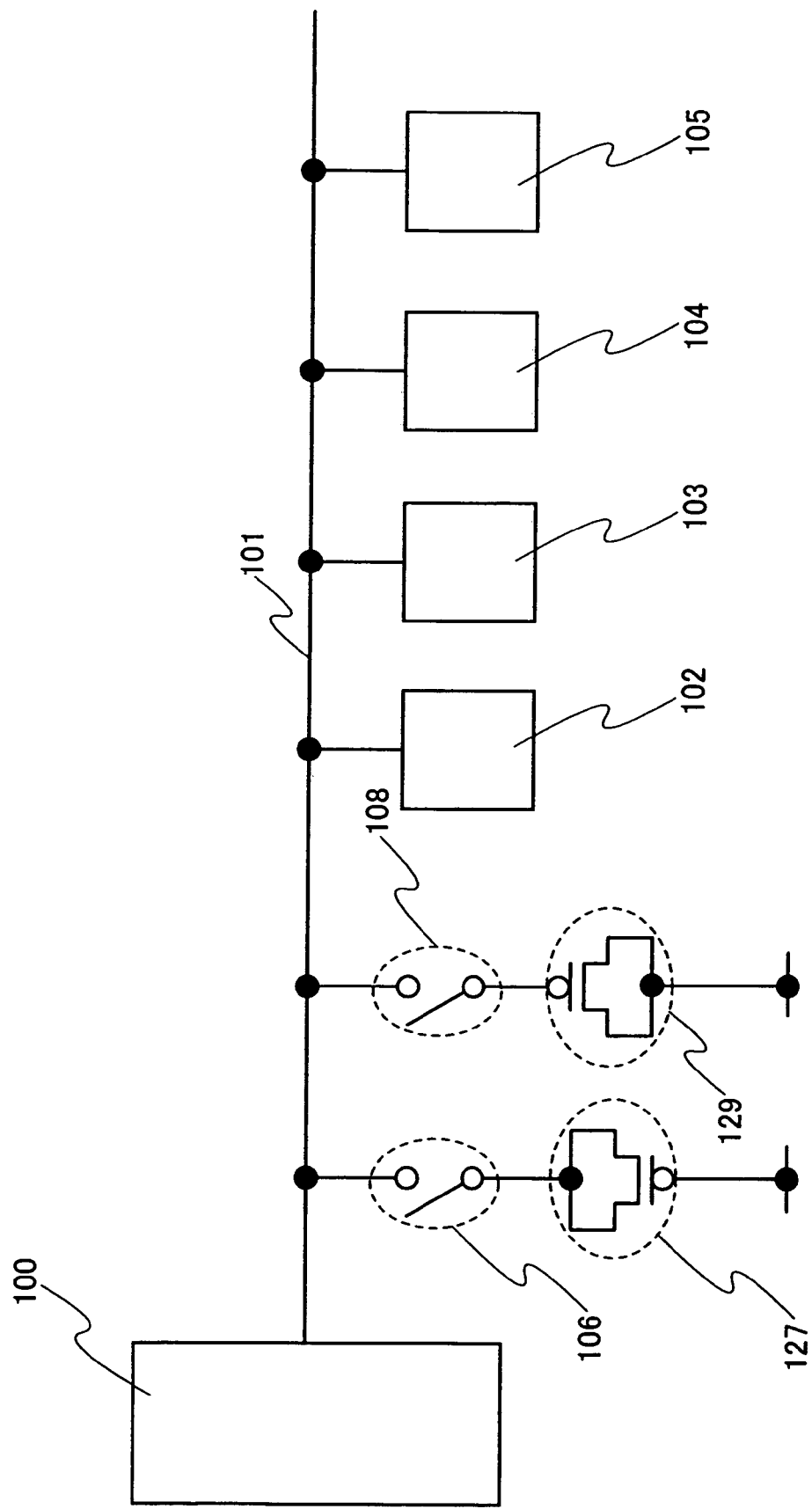
FIG. 5 shows a display device according to an aspect of the present invention.

FIG. 5 shows a case where the first capacitor transistor 127 and the second capacitor transistor 129 are both P-channel thin film transistors. In this case, a source electrode and a drain electrode of a first capacitor transistor 127 are electrically connected to the source signal line 101 via the first switch 106. A gate electrode of a second capacitor transistor 129 is electrically connected to the source signal line 101 via the second switch 108.

Figure 6:
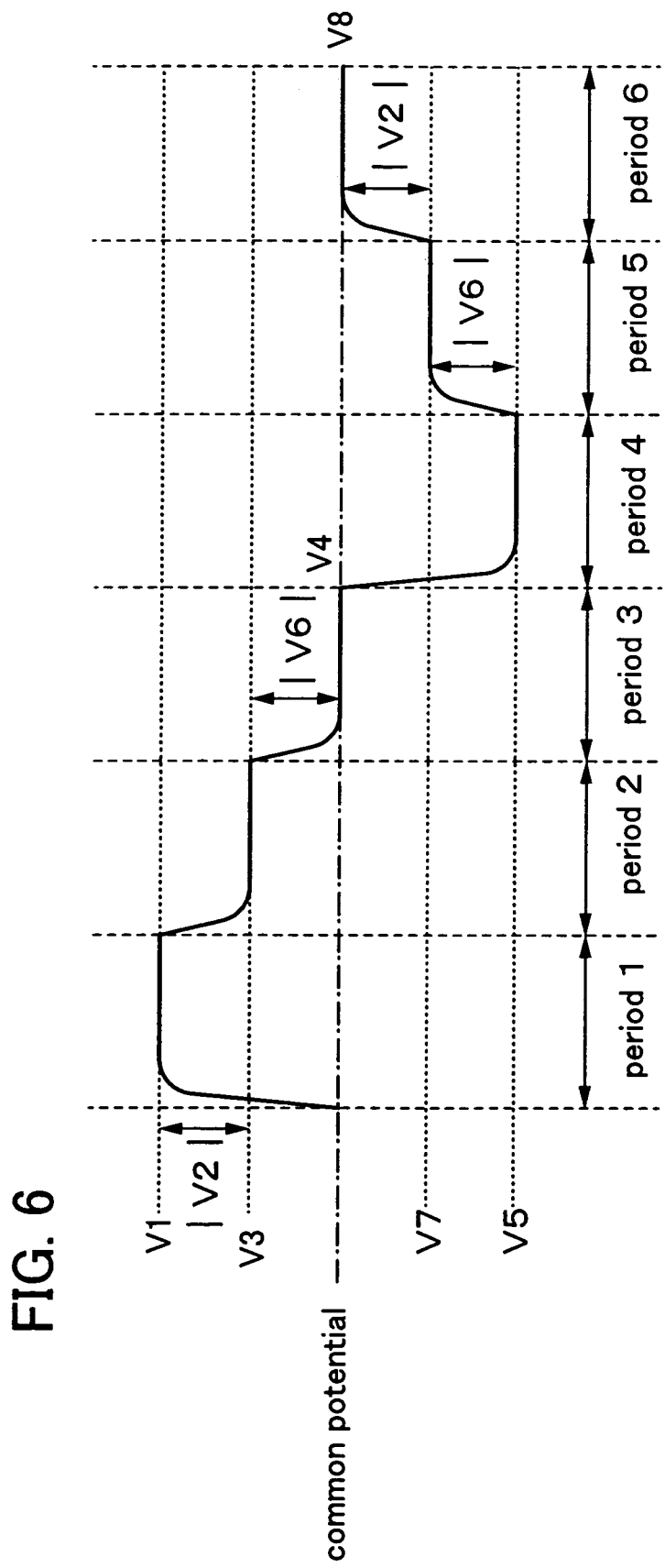
FIG. 6 shows a potential change of a source signal line in a display device according to an aspect of the present invention.

A driving method of a display device of this embodiment mode will be described with reference to FIG. 6. FIG. 6 shows a potential change of the source signal line 101. A period is divided into six periods, and the six periods, period 1 to period 6 are independently described hereinafter.

First, in the period 1, the first switch 106 and the second switch 108 are tuned OFF. Then, a video signal having a positive potential $V_1$ is input to the source signal line 101 from the source signal line driver circuit 100. Since the first switch 106 and the second switch 108 are OFF, a potential of the source signal line 101 becomes $V_1$.

In the period 2, the first switch 106 is turned ON. Then, since the first switch 106 is ON, the first capacitor element 107 is electrically connected to the source signal line 101. Positive charges are stored gradually in the first capacitor element 107, and thus, positive voltage $V_2$ is stored in the first capacitor element 107 and the potential of the source signal line 101 becomes $V_3$. Here, $V_1=V_2+V_3$.

In the period 3, the first switch 106 is turned OFF and the second switch 108 is turned ON. Then, since the first switch 106 is OFF, the first capacitor element 107 is not electrically connected to the source signal line 101, and the positive voltage $V_2$ stored in the first capacitor element 107 in the period 2 is still stored in the first capacitor element 107. Since the second switch 108 is turned ON, the second capacitor element 109 is electrically connected to the source signal line 101, and charges corresponding to a negative voltage $V_6$ which have been stored in the second capacitor element 109 in advance are discharged to the source signal line 101. By discharging the charges, the potential of the source signal line 101 becomes $V_4$. FIG. 6 shows a case where $V_4$ becomes a common potential; however, $V_4$ is not necessarily equal to the common potential. FIG. 6 shows the case of $|V_3|=|V_6|$ as an example, and thus, $V_4$ is equal to the common potential. However, the present invention is not limited to this case.

In the period 4, the second switch 108 is turned OFF. Then, a video signal having negative potential $V_5$ is input to the source signal line 101 from the source signal line driver circuit 100. Then, since the first switch 106 and the second switch 108 are OFF, the potential of the source signal line 101 becomes $V_5$.

In the period 5, the second switch 108 is turned ON. Then, since the second switch is ON, the second capacitor element 109 is electrically connected to the source signal line 101. Then, negative charges are stored gradually in the second capacitor element 109, the negative voltage $V_6$ is stored in the second capacitor element 109, and the potential of the source signal line 101 becomes $V_7$. Here, $V_5=V_6+V_7$.

In the period 6, the first switch 106 is turned ON and the second switch 108 is turned OFF. Then, since the second switch 108 is OFF, the second capacitor element 109 is not electrically connected to the source signal line 101, and the negative voltage $V_6$ which has been stored in the second capacitor element 109 in the period 5 is still stored in the second capacitor element 109. Since the first switch 106 is ON, the first capacitor element 107 is electrically connected to the source signal line 101, and charges corresponding to the positive voltage $V_2$ stored in the first capacitor element 107 in the period 2 are discharged to the source signal line 101. By discharging the charges corresponding to the positive voltage $V_2$ stored in the first capacitor element 107, the potential of the source signal line 101 becomes $V_8$. FIG. 6 shows the case where $V_8$ is a common potential; however, $V_8$ is not necessarily the common potential. FIG. 6 shows a case of $|V_2|=|V_7|$ as an example, and thus, $V_8$ is equal to the common potential. However, the present invention is not limited to this case.

The driving method in the periods 1 to 6 as described above is a basic driving method of a display device according to an aspect of the present invention.

The display device of the present invention described above uses negative voltage stored in the second capacitor element 109 when writing from the positive potential $V_1$ into the negative potential $V_5$ is conducted, and thus, the amount of charges supplied to the source signal line 101 from the source signal line driver circuit 100 is small. Therefore, power consumption can be reduced. This point is described compared with a conventional inversion driving method.

Figure 7:
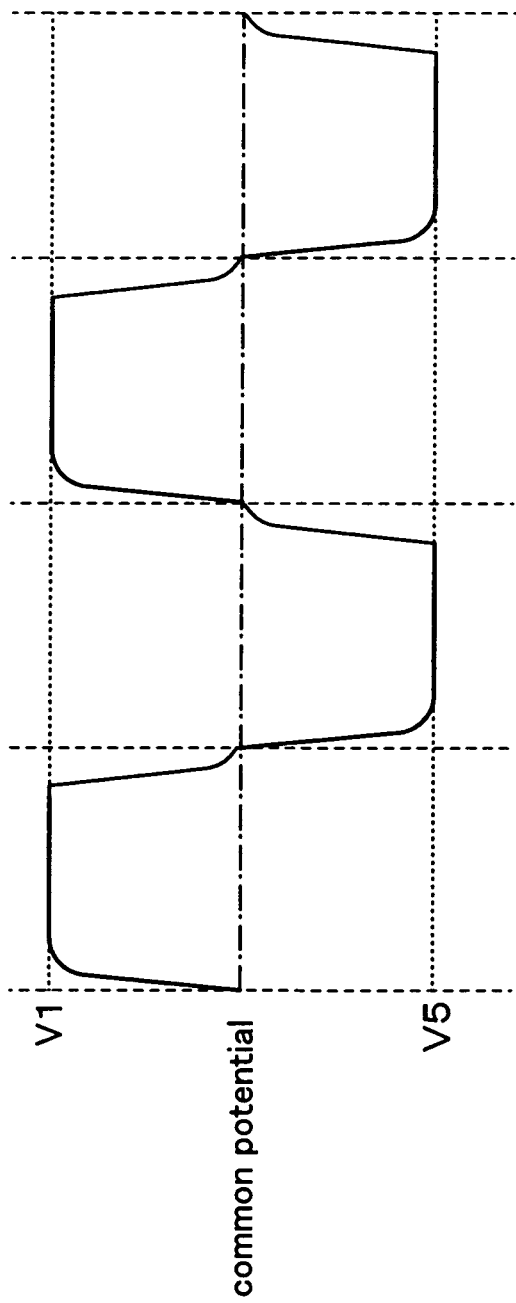
FIG. 7 shows a potential change of a source signal line in a conventional inversion driving method.
Figure 8:
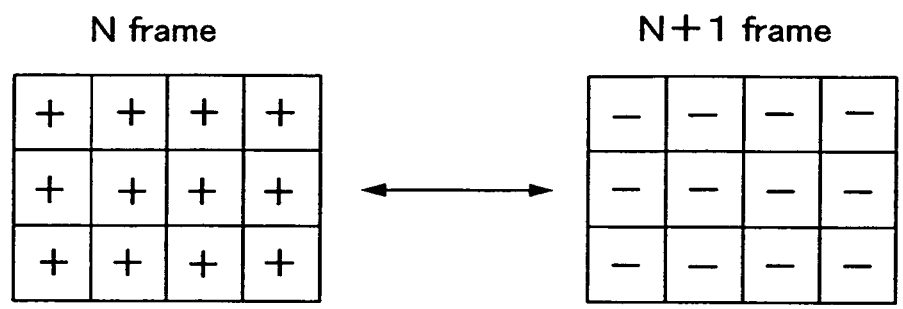
FIG. 8 shows a display pattern of frame inversion driving.

FIG. 7 shows a change of potential of a source signal line in the conventional inversion driving. In the conventional inversion driving, when inversion driving from the positive potential $V_1$ to the negative potential $V_5$ is conducted, it is necessary that charges corresponding to a voltage $V_5-V_1$ are supplied to the source signal line from the source signal line driver circuit.

On the other hand, a case where inversion driving is conducted in a display device of the present invention is described hereinafter. At the time of conducting inversion driving from the positive potential $V_1$ to the negative potential $V_5$, positive voltage $V_2$ is stored in the first capacitor element 107 in the period 2, and thus, the potential of the source signal line 101 is $V_3$ ($=V_1-V_2$), and the negative voltage $V_6$ which has been stored in the second capacitor element 109 in the period 3 is discharged to the source signal line 101, and thus, the potential of the source signal line 101 becomes $V_4$ ($=V_3+$ $V_6$). Therefore, the amount of charges supplied to the source signal line 101 from the source signal line driver circuit 100 in the period 4 corresponds to a voltage $V_5-V_4$.

Here, as apparent from FIG. 6, because of $V_1>V_4$, $|V_5-V_1|>|V_5-V_4|$ is satisfied, and the amount of charges supplied to the source signal line 101 from the source signal line driver circuit 100 in the case of conducting inversion driving using the display device of the present invention is smaller than that of the convention inversion driving. Accordingly, at the time of conducting inversion driving from positive potential $V_1$ to negative potential $V_5$, the inversion driving is conducted using the display device of the present invention, thereby reducing the power consumption more compared with the conventional inversion driving.

In addition, also when writing from the negative potential $V_5$ into the positive potential $V_1$ is conducted, the positive voltage stored in the first capacitor element 107 is used, and thus, the amount of charges supplied to the source signal line 101 from the source signal line driver circuit 100 is small. Therefore, power consumption can be reduced.

At the time of conducting the inversion driving from the negative potential $V_5$ to the positive potential $V_1$, it is necessary that voltage $V_1-V_5$ is supplied to the source signal line from the source signal line driver circuit in the conventional inversion driving as shown in FIG. 7.

On the other hand, in the case of the inversion driving using the display device of the present invention, when inversion driving from the negative potential $V_5$ to the positive potential $V_1$ is conducted, the negative voltage $V_6$ is stored in the second capacitor element 109 in the period 5, and thus, the potential of the source signal line 101 becomes $V_7(=V_5-V_6)$, and charges corresponding to the positive voltage $V_2$ stored in the first capacitor element 107 in the period 6 are discharged to the source signal line 101, and thus, the potential of the source signal line 101 becomes $V_8(=V_7+V_2)$. After that, the potential is increased to the positive potential $V_1$. Therefore, at the time of conducting inversion driving from the negative potential $V_5$ to the positive potential $V_1$, the amount of charges supplied to the source signal line 101 from the source signal line driver circuit 100 corresponds to a voltage $V_1-V_8$.

Here, as apparent from FIG. 6, because of $V_8>V_5$, $|V_1-V_5|>|V_1-V_8|$ is satisfied, and the amount of charges supplied to the source signal line from the source signal line driver circuit in the case of conducting inversion driving using the display device of the present invention is smaller than that of the convention inversion driving. Accordingly, at the time of conducting inversion driving to the positive potential $V_1$ from the negative potential $V_5$, the inversion driving is conducted using a display device of the present invention, thereby reducing the power consumption compared with the conventional inversion driving.

As described above, the display device of the present invention conducts operations of the period 2 and the period 3, or operations of the period 5 and the period 6 by using the first switch 106, the second switch 108, the first capacitor element 107 and the second capacitor element 109, thereby reducing the amplitude width of a potential of a video signal input to the source signal line at the time of conducting inversion driving. Therefore, power consumption can be reduced.

Embodiment 1

In Embodiment 1, a concrete configuration of a display device to which the present invention is applied will be described with reference to FIG. 13.

Figure 13:
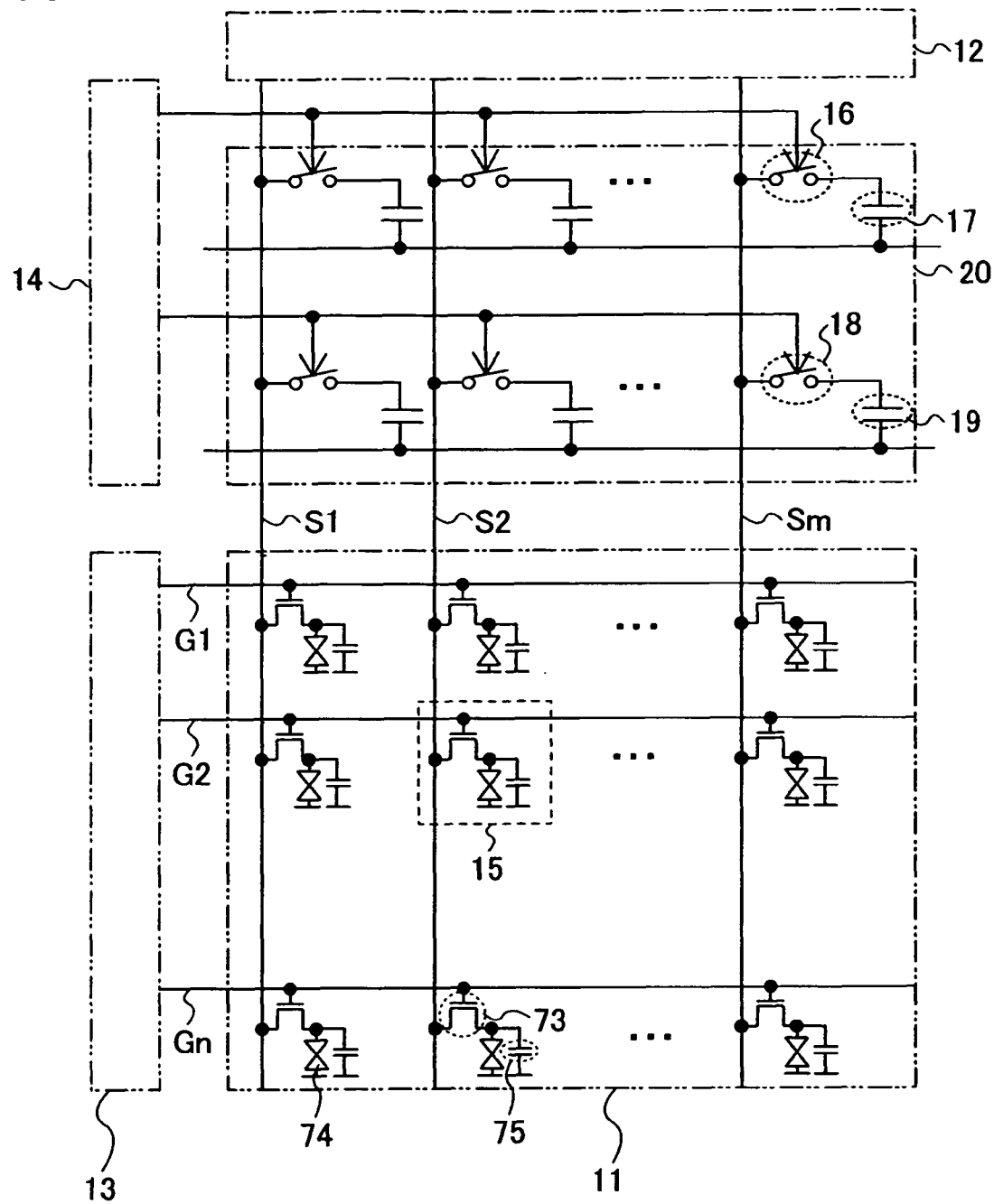
FIG. 13 shows an example of a display device according to an aspect of the present invention.

FIG. 13 schematically shows a display device of the present invention as one example. The display device of the present invention includes a pixel portion 11, a first driver circuit 12 and a second driver circuit 13. The pixel portion 11 includes a plurality of pixels 15 and each of the pixels 15 includes a transistor 73, a capacitor element 75 and a liquid crystal element 74. The first driver circuit 12 is a source signal line driver circuit, and a video signal is output to source signal lines $S_1$ to $S_m$ from the first driver circuit 12. The second driver circuit 13 is a gate signal line driver circuit, and a scan signal is output to gate signal lines $G_1$ to $G_n$ from the second driver circuit 13. The first driver circuit 12 and the second driver circuit 13 may be formed over the same substrate as the pixel portion 11, or over a different substrate from that of the pixel portion 11. When the first driver circuit 12 and the second driver circuit 13 are formed using thin film transistors, the first driver circuit 12 and the second driver circuit 13 can be formed over the same substrate as the pixel portion 11.

One terminal of a first switch 16 and one terminal of a second switch 18 are electrically connected in parallel to each source signal line in a region 20. The first switch 16 and the second switch 18 are each formed from a transistor such as a thin film transistor, for example.

Figure 14:
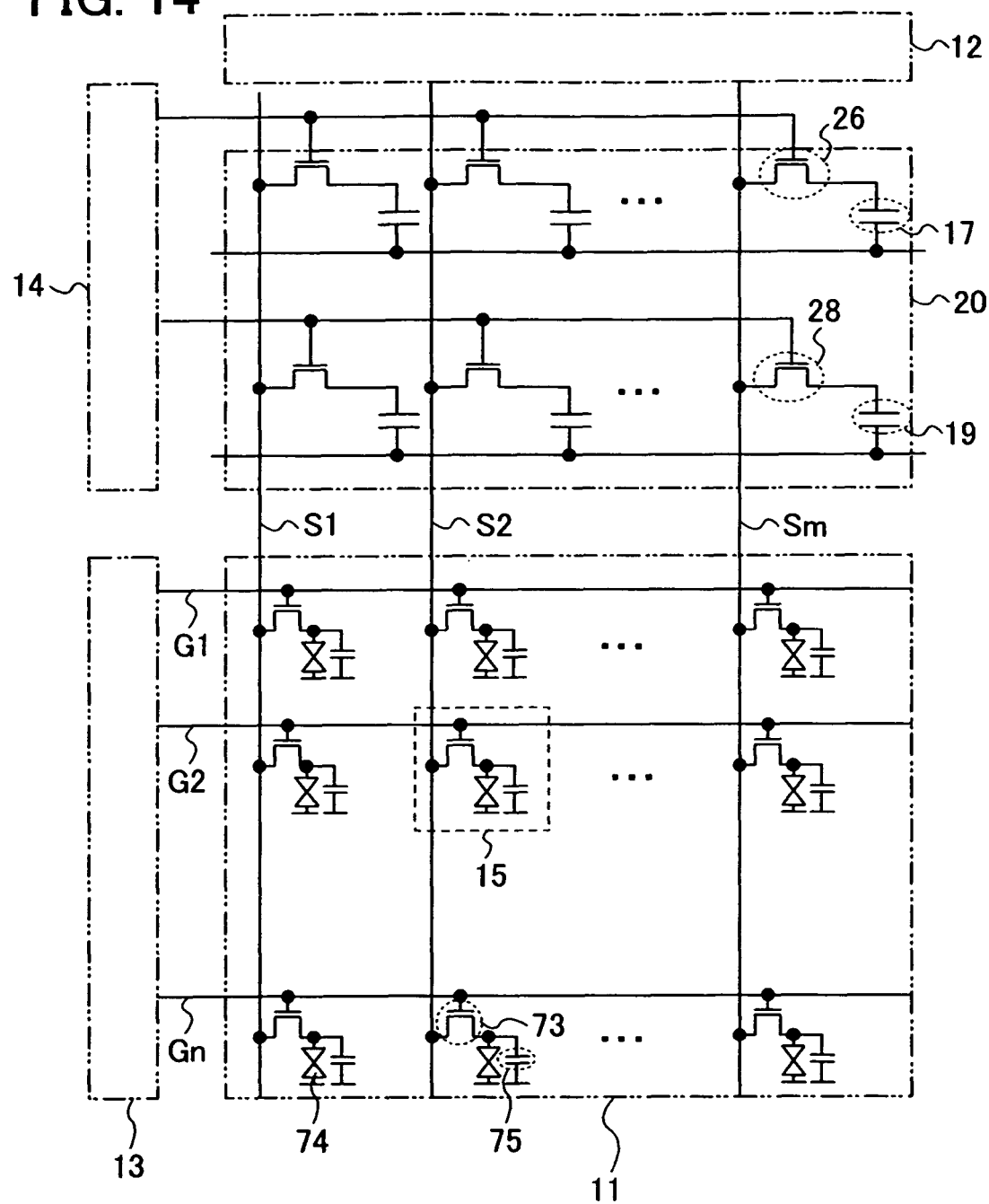
FIG. 14 shows an example of a display device according to an aspect of the present invention.

FIG. 14 shows a case where the first switch 16 and the second switch 18 are formed from transistors. In FIG. 14, transistors are used as the first switch 16 and the second switch 18, and referred to as a first transistor 26 and a second transistor 28. Only these parts are different from those in FIG. 13. The other parts than these parts are denoted by the same reference numerals as those in FIG. 13.

Figure 15:
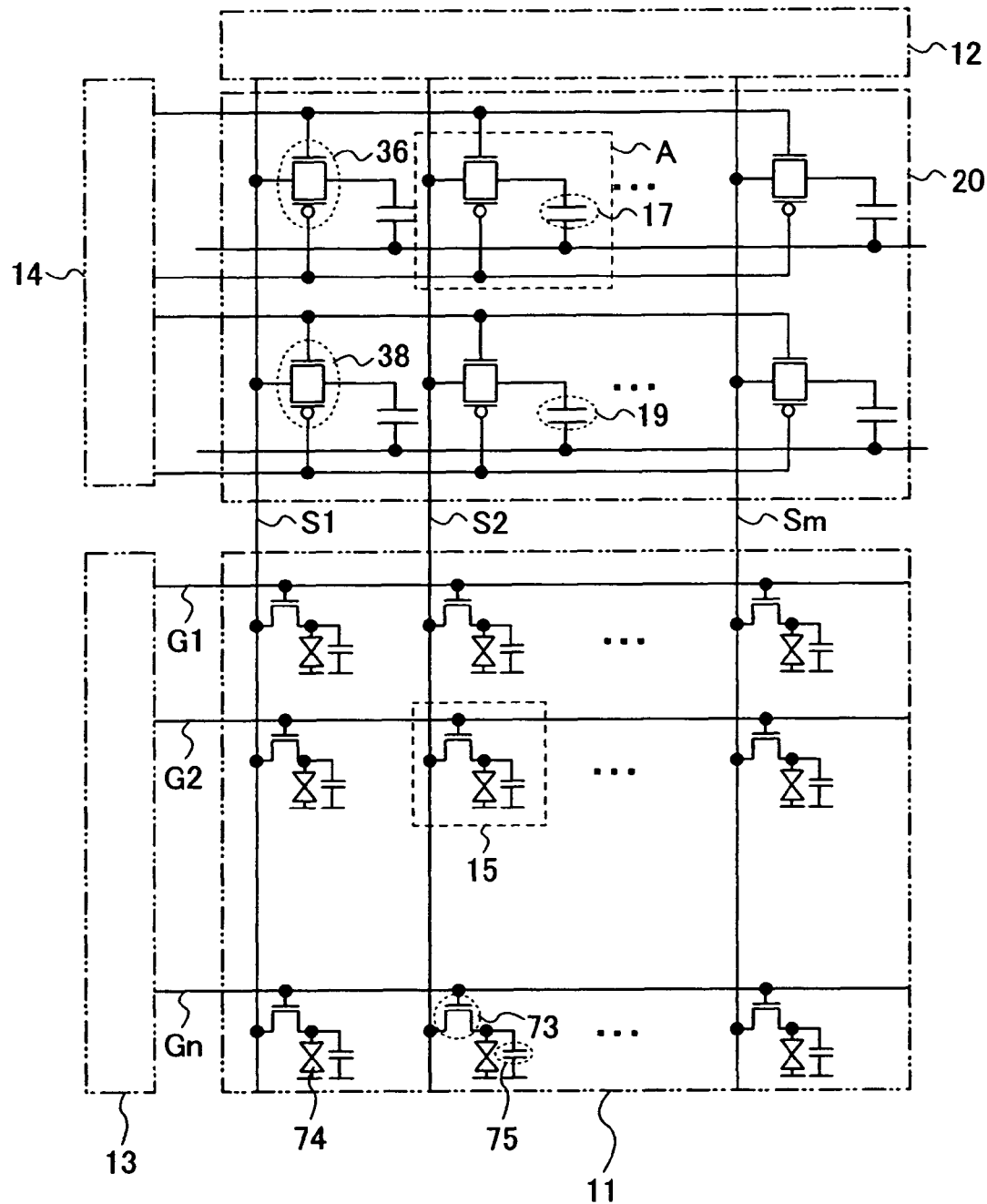
FIG. 15 shows an example of a display device according to an aspect of the present invention.

FIG. 15 shows a case where the first switch 16 and the second switch 18 are each formed from a complementary type circuit including an N-channel type transistor and a P-channel type transistor (CMOS circuit). In FIG. 15, the first switch 16 and the second switch 18 are formed from CMOS circuits, and referred to as a first CMOS circuit 36 and a second CMOS circuit 38. Only these parts are different from those in FIG. 13. The other parts than these parts are denoted by the same reference numerals as those in FIG. 13.

The other terminal of the first switch 16 is electrically connected to a first electrode of a first capacitor element 17 for storing positive charges, and the other terminal of the second switch 18 is electrically connected to a first electrode of a second capacitor element 19 for storing negative charges. In each of FIGS. 13 to 15, the second electrodes of the first capacitor elements 17, which are each electrically connected to a source signal line, are all electrically connected to the same wire, and the second electrodes of the second capacitor elements 19 which are each electrically connected to a source signal line, are all electrically connected to the same wire; however, the present invention is not limited to this. Each of the second electrodes of the first capacitor element 17 and the second capacitor element 19 may be kept at a constant potential. Thus, the second electrodes of the first capacitor element 17 and the second capacitor element 19 may be grounded.

Conduction (ON) and non conduction (OFF) of the first switch 16 and the second switch 18 are controlled by a third driver circuit 14. Note that the third driver circuit 14 which controls the first switch 16 and the second switch 18 may be formed over the same substrate as the pixel portion 11, or may be formed over a substrate different from that of the pixel portion 11 and a signal for controlling the first switch 16 and the second switch 18 may be input from the outside of the substrate provided with the pixel portion. When the third driver circuit 14 is formed using a thin film transistor, the third driver circuit 14 can be formed over the same substrate as the pixel portion 11. Here, the first switch 16 and the second switch 18 are controlled by the same driver circuit; however, the first switch 16 and the second switch 18 may be controlled by different driver circuits.

In FIG. 13, in the region 20 between the first driver circuit (source signal line driver circuit) 12 and the pixel portion 11, the first capacitor element 17 is electrically connected to the source signal line via the first switch 16, and the second capacitor element 19 is electrically connected to the source signal line via the second switch 18; however, the present invention is not limited to this case.

Figure 16:
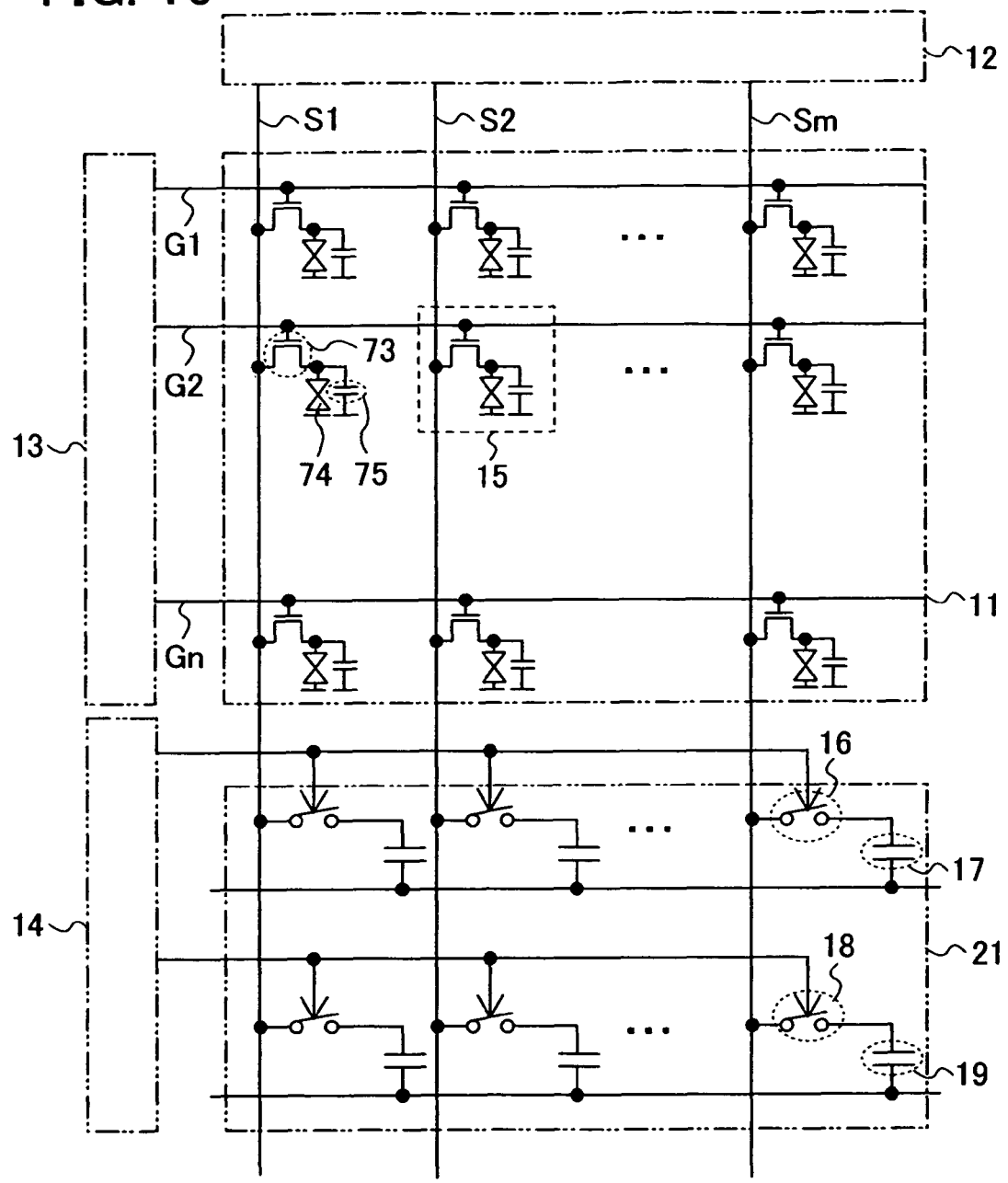
FIG. 16 shows an example of a display device according to an aspect of the present invention.

As shown in FIG. 16, in a region 21 (the region opposite to the first driver circuit 12 with the pixel portion 11 therebetween) near an end portion of the source signal line which is on a side opposite to the first driver circuit 12 (source signal line driver circuit), the first capacitor element 17 is electrically connected to a source signal line via the first switch 16, and the second capacitor element 19 is electrically connected to a source signal line via the second switch 18. In this case, since another circuit is not provided in the region 21 (region opposite to the first driver circuit 12 with the pixel portion 11 therebetween) near the end portion of the source signal line which is on a side opposite to the first driver circuit 12 (source signal line driver circuit), a large capacitor element which has an electrode having a large area and has a large capacity can be formed. Therefore, the amount of charges stored in the capacitor element can be increased. More charges can be stored in the capacitor elements, and the stored charges are used in the inversion driving, thereby reducing the charges output from the source signal line driver circuit. Thus, driving can be conducted efficiently.

Figure 17:
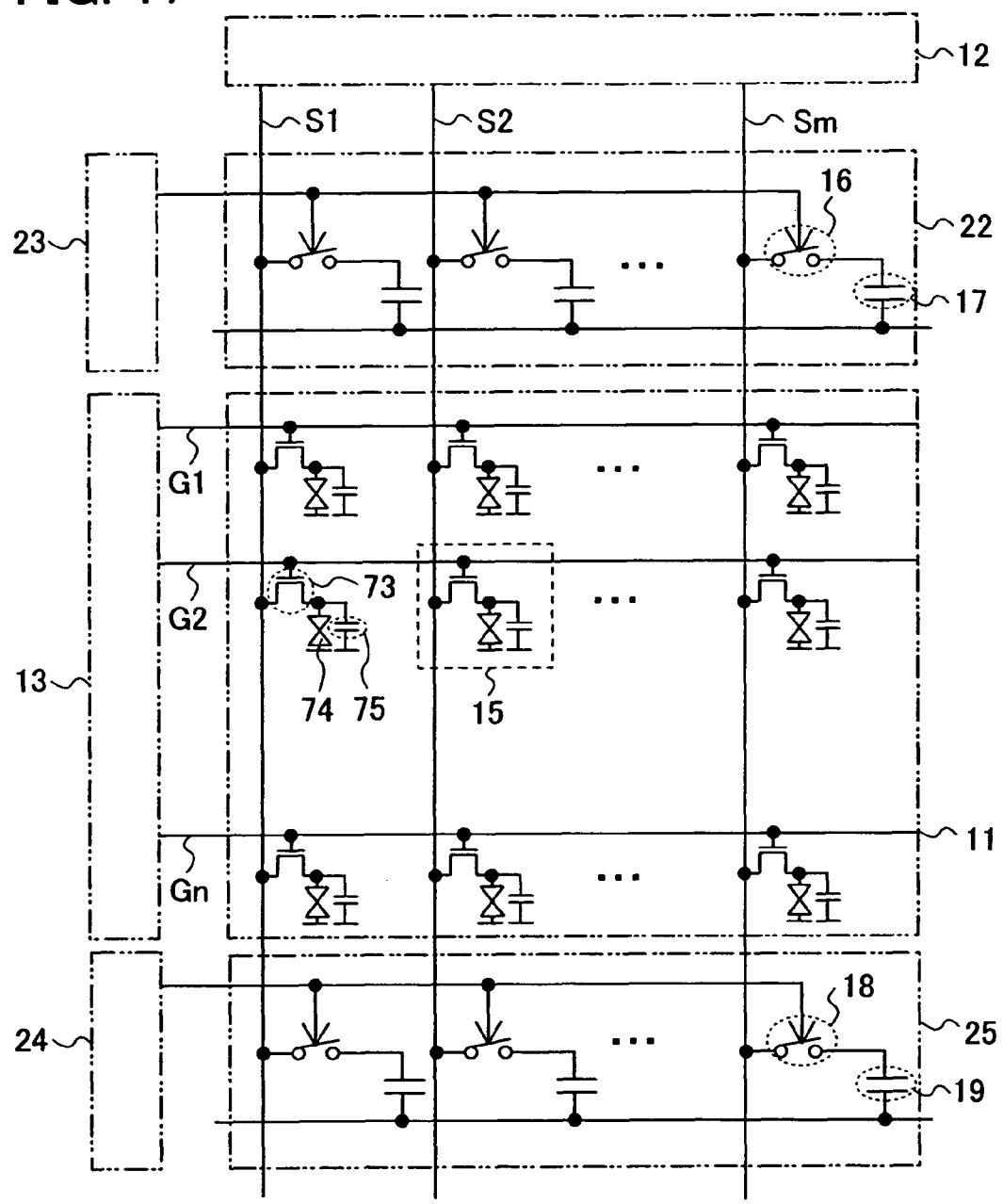
FIG. 17 shows an example of a display device according to an aspect of the present invention.

In addition, as shown in FIG. 17, in a region 22 between the first driver circuit (source signal line driver circuit) 12 and the pixel portion 11, the first capacitor element 17 may be electrically connected to a source signal line via the first switch 16 which is controlled by a driver circuit 23, and in a region 25 (region opposite to the first driver circuit 12 with the pixel portion 11 therebetween) near an end portion of the source signal line which is on a side opposite to the first driver circuit 12 (source signal line driver circuit), the second capacitor element 19 which is controlled by a driver circuit 24 may be electrically connected to the source signal line via the second switch 18.

Further, in FIG. 17, positions of the first switch 16 and the second switch 18 may be exchanged, or positions of the first capacitor element 17 and the second capacitor element 19 may be exchanged. In other words, the second capacitor element 19 is electrically connected to the source signal line via the second switch 18 in the region 22, and the first capacitor element 17 is electrically connected to the source signal line via the first switch 16.

Embodiment 2

Embodiment 2 will describe a driving method in a case where the present invention is applied to gate line inversion driving.

Figure 9:
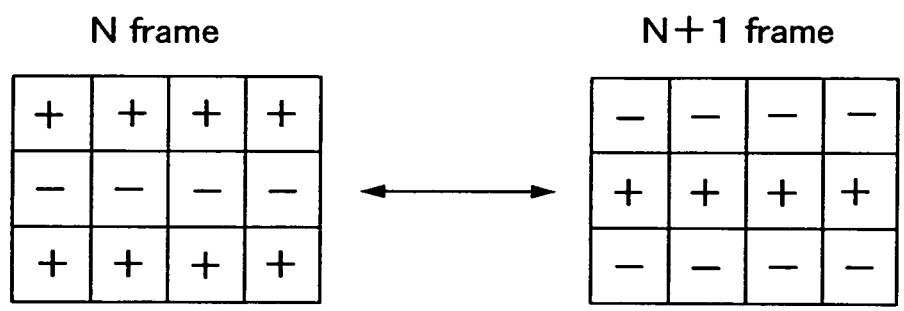
FIG. 9 shows a display pattern of gate line inversion driving.

FIG. 9 shows a display diagram of gate line inversion driving. The display pattern diagram shown in FIG. 9 shows a model screen with display pixels of three rows×four columns as one example for simplification. A case of driving method for display pixels of three rows×four columns is described below as an example for simplification.

In the gate line inversion driving, a video signal is supplied to each pixel such that gate lines adjacent to each other have an opposite polarity to each other as shown in FIG. 9. In other words, the polarity of a video signal supplied to a source signal line is inverted every time writing is made to one gate signal line. A video signal having an opposite polarity to that of the video signal for N-th frame is supplied to each pixel of (N+1)-th frame. In other words, the polarity of a video signal supplied to each pixel is inverted every frame. Note that N is a natural number of 1 or more.

Figure 18:
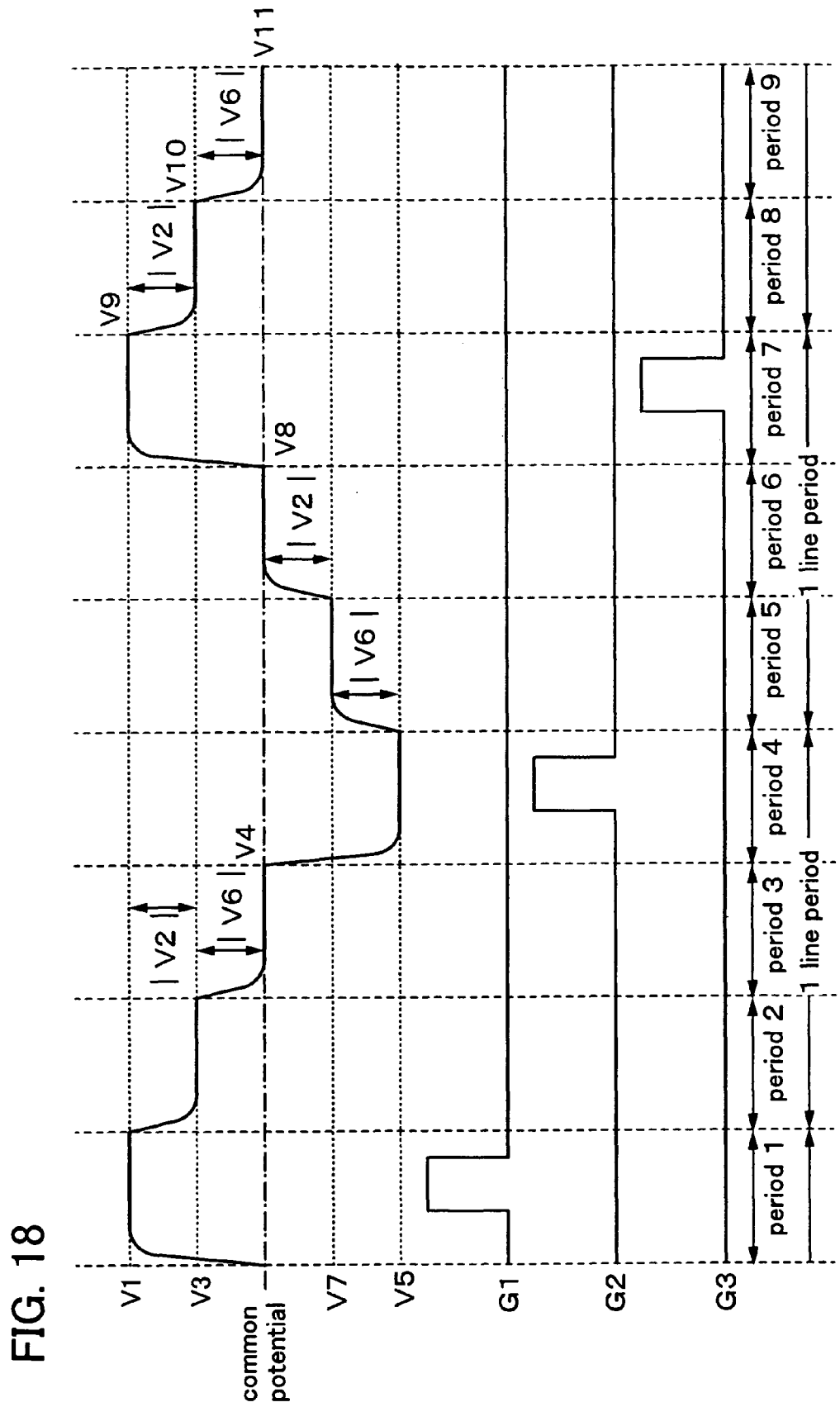
FIG. 18 shows a driving method in a case where the present invention is applied to gate line inversion driving.

FIG. 18 shows a timing chart in a case where the present invention is applied to a gate line inversion driving method. A driving method in the case where the present invention is applied to the gate line inversion driving method is described with reference to FIG. 18. In the timing chart of FIG. 18, the chart showing a potential change of a source signal line shows a potential change of an arbitrary source signal line $S_x$ among source signal lines $S_1$ to $S_m$, and description is made of the source signal line $S_x$. Note that x fulfils $1 \leq x \leq m$.

First, in the period 1, the first switch and the second switch are tuned OFF. Then, a video signal having a positive potential $V_1$ is input to a source signal line $S_x$ from a first driver circuit 12 (source signal line driver circuit). Since the first switch and the second switch which are electrically connected to the source signal line $S_x$ are OFF, a potential of the source signal line $S_x$ is $V_1$.

In the period 1, a signal of ON is input to a gate signal line $G_1$, at a first row. Then, a thin film transistor included in a pixel which is electrically connected to the gate signal line at the first row is turned ON, and a video signal is supplied to each pixel which is electrically connected to the gate signal line at the first row from the source signal lines $S_1$ to $S_m$. Thus, a positive potential $V_1$ is written to a pixel of the first row which is electrically connected to the source signal line $S_x$.

In the period 2, the first switch is turned ON. Then, since the first switch is ON, the first capacitor element is electrically connected to the source signal line $S_x$. Positive charges are stored gradually in the first capacitor element, and thus, a positive voltage $V_2$ is stored in the first capacitor element and the potential of the source signal line $S_x$ becomes $V_3$. Here, $V_1=V_2+V_3$.

In the period 3, the first switch is turned OFF and the second switch is turned ON. Then, since the first switch is OFF, the first capacitor element is not electrically connected to the source signal line $S_x$, the positive voltage $V_2$ stored in the first capacitor element in the period 2, is still stored in the first capacitor element. Since the second switch is turned ON, the second capacitor element is electrically connected to the source signal line $S_x$, and charges corresponding to a negative voltage $V_6$ which have been stored in the second capacitor element 109 in advance are discharged to the source signal line $S_x$. By discharging the charges, the potential of the source signal line $S_x$ becomes $V_4$. FIG. 18 shows a case where $V_4$ becomes a common potential; however, $V_4$ is not necessarily equal to the common potential. FIG. 18 shows the case of $|V_3|=|V_6|$ as an example, and thus, $V_4$ is equal to the common potential. However, the present invention is not limited to this case.

In the period 4, the second switch is turned OFF. Then, a video signal having negative potential $V_5$ is input to the source signal line $S_x$ from the first driver circuit 12 (source signal line driver circuit). Then, since the first switch and the second switch are OFF, the potential of the source signal line $S_x$ becomes $V_5$.

In the period 4, a signal of ON is input to a gate signal line $G_2$ at a second row. Then, a thin film transistor included in a pixel which is electrically connected to the gate signal line $G_2$ at the second row is turned ON, and a video signal is supplied to each pixel which is electrically connected to the gate signal line $G_2$ at the second row from the source signal lines $S_1$ to $S_m$. Thus, a negative potential $V_1$ is input to a pixel of the first row electrically connected to the source signal line $S_x$.

In the period 5, the second switch is turned ON. Then, since the second switch is ON, the second capacitor element is electrically connected to the source signal line $S_x$. Then, negative charges are stored gradually in the second capacitor element, negative voltage $V_6$ is stored in the second capacitor element, and the potential of the source signal line $S_x$ becomes $V_7$. Here, $V_5 = V_6 + V_7$.

In the period 6, the first switch is turned ON and the second switch is turned OFF. Then, since the second switch is OFF, the second capacitor element is not electrically connected to the source signal line $S_x$, the negative voltage $V_6$ which has been stored in the second capacitor in the period 5 is still stored in the second capacitor element. Since the first switch is ON, the first capacitor element is electrically connected to the source signal line $S_x$, and charges corresponding to the positive voltage $V_2$ stored in the first capacitor element in the period 2 are discharged to the source signal line $S_x$. By discharging the charges, the potential of the source signal line $S_x$ becomes $V_8$. FIG. 18 shows the case where $V_8$ is a common potential; however, $V_8$ is not necessarily the common potential. FIG. 18 shows a case of $|V_2|=|V_7|$ as an example, and thus, $V_8$ is equal to the common potential. However, the present invention is not limited to this case.

In the period 7, the first switch and the second switch are tuned OFF. Then, a video signal having the positive potential $V_1$ is input to the source signal line $S_x$ from the first driver circuit 12 (source signal line driver circuit). Since the first switch and the second switch are OFF, a potential of the source signal line $S_x$ is $V_1$.

In the period 7, a signal of ON is input to a gate signal line $G_3$ at a third row. Then, a thin film transistor included in a pixel which is electrically connected to the gate signal line $G_3$ at the third row is turned ON, and a video signal is supplied to each pixel which is electrically connected to the gate signal line $G_3$ at the third row from the source signal lines $S_1$ to $S_m$. Thus, a positive potential $V_1$ is written to a pixel of the third row electrically connected to the source signal line $S_x$.

In the period 8, the first switch is turned ON. Then, since the first switch is ON, the first capacitor element is electrically connected to the source signal line $S_x$. Positive charges are stored gradually in the first capacitor element, and thus, the positive voltage $V_2$ is stored in the first capacitor element and the potential of the source signal line $S_x$ becomes $V_3$.

In the period 9, the first switch is turned OFF and the second switch is turned ON. Then, since the first switch is OFF, the first capacitor element is not electrically connected to the source signal line $S_x$, the positive voltage $V_2$ stored in the first capacitor element in the period 8, is still stored in the first capacitor element. Since the second switch is turned ON, the second capacitor element is electrically connected to the source signal line $S_x$, and charges corresponding to the negative voltage $V_6$ which have been stored in the second capacitor element 109 in the period 5 are discharged to the source signal line $S_x$. By discharging the charges, the potential of the source signal line $S_x$ becomes $V_4$.

By conducting the operations for the periods 1 to 9 as described above, writing of one frame is completed.

Note that the ON-OFF operations of the first switch and the second switch in the periods 7, 8 and 9 are the same as the ON-OFF operations of the first switch and the second switch in the periods 1, 2 and 3. Therefore, in consideration of the potential change of the source signal line only, the potential change of the periods 7, 8 and 9 is the same as that of the periods 1, 2, and 3.

A video signal is supplied to a pixel of the first row in the period 1, a video signal is supplied to a pixel of the second row in the period 4, a video signal is supplied to a pixel of the third row in the period 7, and thus, the period having the periods 2, 3 and 4 and the period having the periods 5, 6 and 7 each correspond to one line period.

In the above description, the case where the display pixels are three rows×four columns of n rows×m columns has been explained; however, the present invention is not limited to this case, i.e., n=3, m=4, and the same driving can be conducted to other cases.

In focusing on the potential change of the source signal line, the periods 1 to 6 become one cycle. In other words, the periods 1 to 6 become one cycle of inversion driving. Thus, in the case of expanding to n rows×m columns, the potential change of the source signal line may be repeated with regarding the periods 1 to 6 as one cycle at the time of conducting writing up to the n-th row.

As described above, the gate line inversion driving to which the present invention is applied has the operations of the periods 2 and 3 or the operations of the periods 5 and 6, and therefore, an amplitude width of a video signal to input to a source signal line can be made small at the time of conducting inversion driving. Accordingly, power consumption can be reduced.

In order to conduct the driving method described in this embodiment, a display device which has been described, for example, in Embodiment 1 may be used.

Embodiment 3

Embodiment 3 will describe a driving method in a case where the present invention is applied to source line inversion driving.

Figure 10:
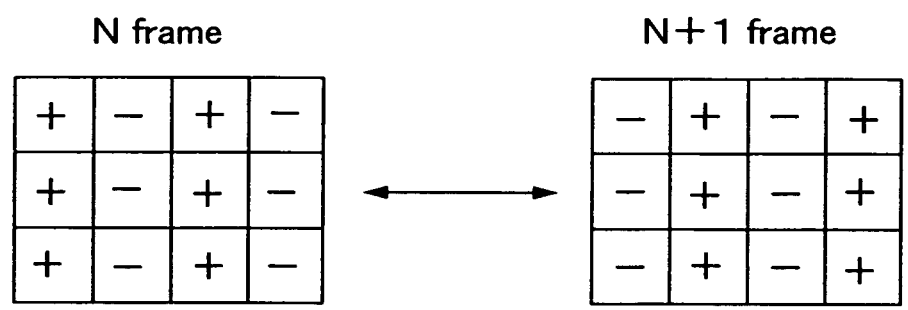
FIG. 10 shows a display pattern of source line inversion driving.

FIG. 10 shows a display diagram of source line inversion driving. The display pattern diagram shown in FIG. 10 shows a model screen with display pixels of three rows×four columns as one example for simplification.

In the source line inversion driving, a video signal is supplied to each pixel such that source lines adjacent to each other have an opposite polarity to each other as shown in FIG. 10. A video signal having an opposite polarity to that of the video signal for N-th frame is supplied to each pixel of (N+1)-th frame. In other words, the polarity of a video signal supplied to each pixel is inverted for each frame.

Figure 19:
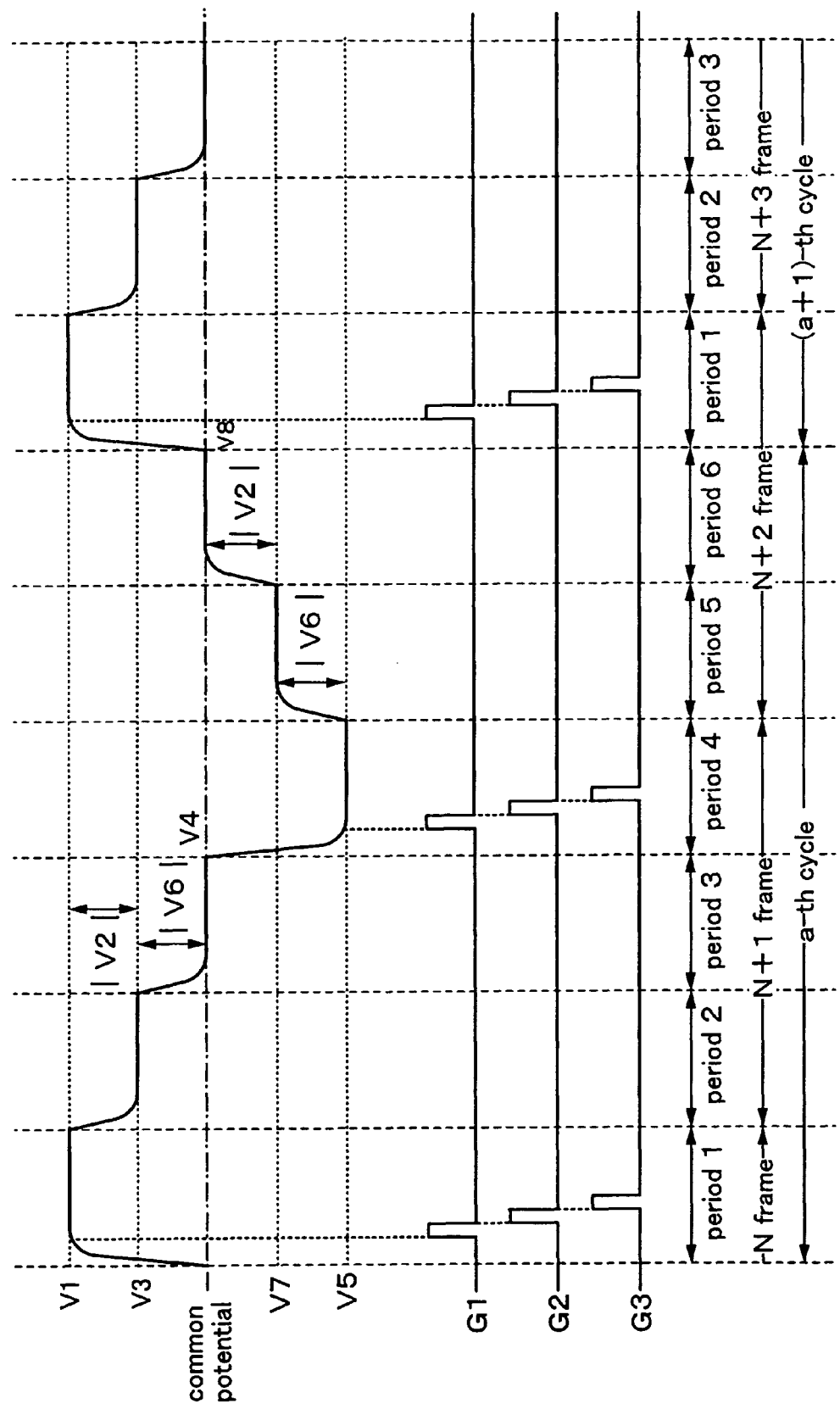
FIG. 19 shows a driving method in a case where the present invention is applied to source line inversion driving.

FIG. 19 shows a timing chart in a case where the present invention is applied to a source line inversion driving method. A driving method in the case where the present invention is applied to the source line inversion driving method is described with reference to FIG. 19. In the timing chart of FIG. 19, the chart showing a potential change of a source signal line shows a potential change of an arbitrary source signal line $S_x$ among source signal lines $S_1$ to $S_m$, and description is made of the source signal line $S_x$ hereinafter.

First, in the period 1, the first switch and the second switch are tuned OFF. Then, a video signal having a positive potential $V_1$ is input to a source signal line $S_x$ from the first driver circuit 12 (source signal line driver circuit). Since the first switch and the second switch which are electrically connected to the source signal line $S_x$ are OFF, a potential of the source signal line $S_x$ is $V_1$.

After that, a signal of ON is input to the gate signal line $G_1$ at the first row. Then, a thin film transistor included in a pixel which is electrically connected to the gate signal line at the first row is turned ON, and a video signal is supplied to each pixel which is electrically connected to the gate signal line $G_1$ at the first row from the source signal lines $S_1$ to $S_m$. Thus, a positive potential $V_1$ is supplied to a pixel of the first row electrically connected to the source signal line $S_x$. After completing writing a signal to the gate signal line $G_1$ at the first row, an ON-signal is input to the second gate signal line $G_2$ at the second row and writing in a pixel at the second row is conducted. In this manner, writing is conducted up to the n-th row.

In the period 1, when writing of a video signal having a positive potential to the first up to n-th rows is completed, the period is shifted to the period 2.

In the period 2, the first switch is turned ON. Then, since the first switch is ON, the first capacitor element is electrically connected to the source signal line $S_x$. Positive charges are stored gradually in the first capacitor element, and thus, positive voltage $V_2$ is stored in the first capacitor element and the potential of the source signal line $S_x$ becomes $V_3$. Here, $V_1=V_2+V_3$.

In the period 3, the first switch is turned OFF and the second switch is turned ON. Then, since the first switch is OFF, the first capacitor element is not electrically connected to the source signal line $S_x$, the positive voltage $V_2$ stored in the first capacitor element in the period 2, is still stored in the first capacitor element. Since the second switch is turned ON, the second capacitor element is electrically connected to the source signal line $S_x$, and charges corresponding to negative voltage $V_6$ which have been stored in the second capacitor element 109 are discharged to the source signal line $S_x$. By discharging the charges, the potential of the source signal line $S_x$ becomes $V_4$. FIG. 19 shows a case where $V_4$ becomes a common potential; however, $V_4$ is not necessarily equal to the common potential. FIG. 19 shows the case of $|V_3|=|V_6|$ as an example, and thus, $V_4$ is equal to the common potential. However, the present invention is not limited to this case.

In the period 4, the second switch is turned OFF. Then, a video signal having negative potential $V_5$ is input to the source signal line $S_x$ from the first driver circuit 12 (source signal line driver circuit). Then, the first switch and the second switch are OFF, the potential of the source signal line $S_x$ becomes $V_5$.

Then, a signal of ON (ON-signal) is input to the gate signal line $G_1$ at the first row. Then, a thin film transistor included in a pixel which is electrically connected to the gate signal line $G_1$ at the first row is turned ON, and a video signal is supplied to each pixel which is electrically connected to the gate signal line $G_1$ at the first row from the source signal lines $S_1$ to $S_m$. Thus, a positive potential $V_1$ is supplied to a pixel of the first row electrically connected to the source signal line $S_x$. After completing writing the video signal to the gate signal line $G_1$ at the first row, an ON-signal is input to the second gate signal line $G_2$ at the second row and writing in a pixel at the second row is conducted. In this manner, writing is conducted up to the n-th row.

In the period 4, when writing of a video signal having a negative potential to the first up to n-th rows is completed, the period is shifted to the period 5.

In the period 5, the second switch is turned ON. Then, since the second switch is ON, the second capacitor element is electrically connected to the source signal line $S_x$. Then, negative charges are stored gradually in the second capacitor element, negative voltage $V_6$ is stored in the second capacitor element, and the potential of the source signal line $S_x$ becomes $V_7$. Here, $V_5=V_6+V_7$.

In the period 6, the first switch is turned ON and the second switch is turned OFF. Then, since the second switch is OFF, the second capacitor element is not electrically connected to the source signal line $S_x$, negative voltage $V_6$ which has been stored in the second capacitor element in the period 5 is still stored in the second capacitor element. Since the first switch is ON, the first capacitor element is electrically connected to the source signal line $S_x$, and charges corresponding to the positive voltage $V_2$ stored in the first capacitor element in the period 2 are discharged to the source signal line $S_x$. By discharging the charges, the potential of the source signal line $S_x$ becomes $V_8$. FIG. 19 shows the case where $V_8$ is a common potential; however, $V_8$ is not necessarily the common potential. FIG. 19 shows a case of $|V_2|=|V_7|$ as an example, and thus, $V_8$ is equal to the common potential. However, the present invention is not limited to this case.

The periods 1 to 6 as described above become one cycle. By repeating the cycle, source line inversion driving can be conducted. FIG. 19 shows operations of from the period 1 in a-th cycle to the period 3 of (a+1)-th cycle. By repeating one cycle including the periods 1 to 6, the operations of the periods 1 to 3 in the (a+1)-th cycle is the same as those of the periods 1 to 3 in the a-th cycle. Note that a is a natural number of 1 or more.

When the period 1 of the a-th cycle belongs to N frame, the periods 2 to 4 of the a-th cycle correspond to N+1 frame, and from the period 5 of the a-th cycle to the period 1 of the (a+1)-th cycle correspond to N+2 frame. The periods 2 to 3 of the (a+1)th cycle belong to N+3 frame.

As described above, since the source line inversion driving to which the present invention is applied includes the operations of the periods 2 and 3 or the operations of the periods 5 and 6, and therefore, an amplitude width of a video signal to input to a source signal line can be made small at the time of conducting inversion driving. Accordingly, power consumption can be reduced.

Figure 20:
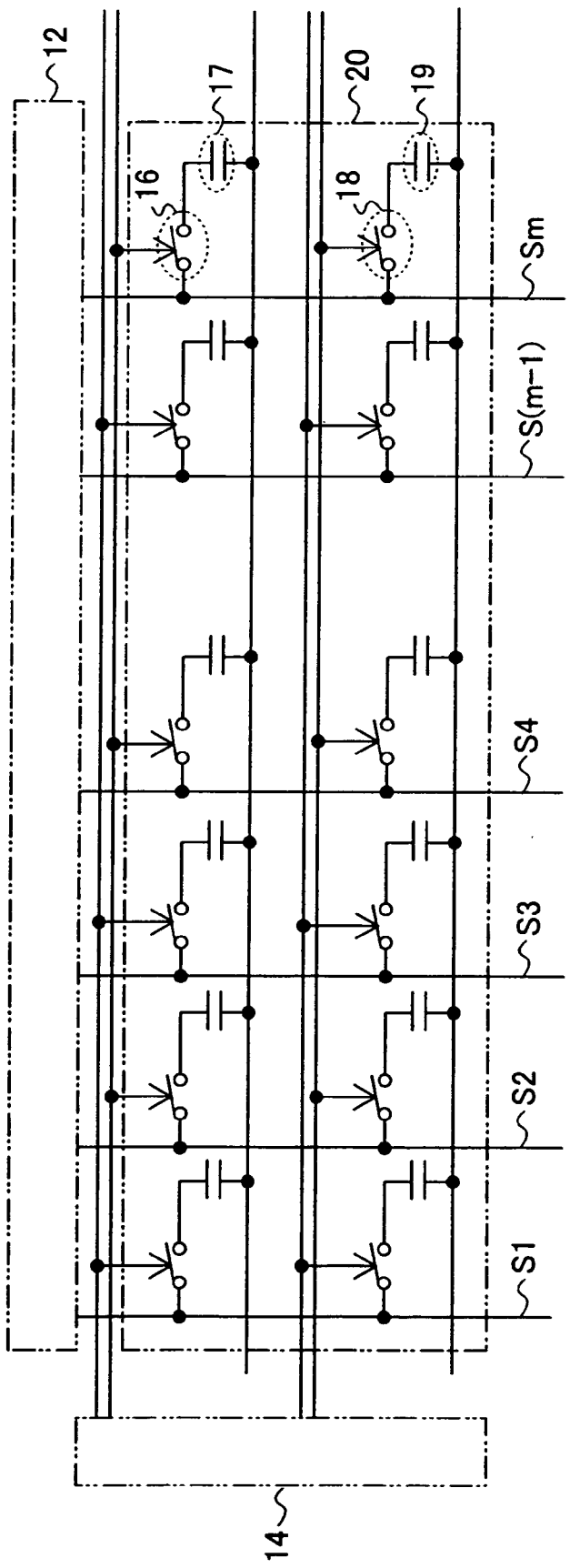
FIG. 20 shows a control method of first and second switches in a case where the present invention is applied to source line inversion driving.

In the case where source line inversion driving is conducted as in this embodiment, when the first switch and the second switch which are each electrically connected to a source signal line are controlled, controlling may be made such that odd-numbered switches are electrically connected to the same wire and even-numbered switches are electrically connected to the same wire, as shown in FIG. 20.

Embodiment 4

Embodiment 4 will describe a driving method in which the present invention is applied to dot inversion driving.

Figure 11:
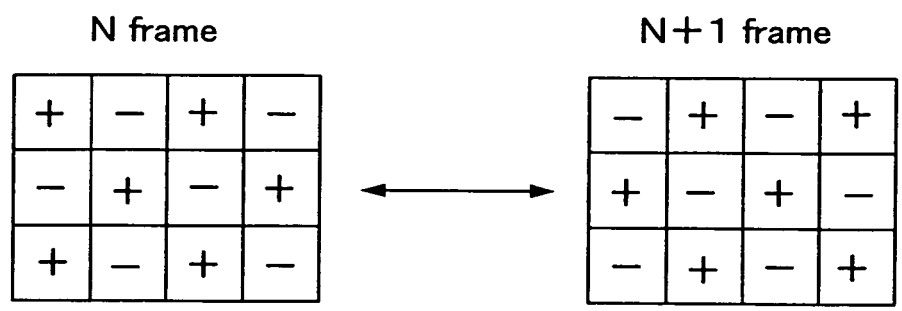
FIG. 11 shows a display pattern of dot inversion driving.

FIG. 11 shows a display pattern diagram of dot inversion driving. The display pattern diagram shown in FIG. 11 shows a model screen with display pixels of three rows×four columns as one example for simplification.

In the dot inversion driving, a video signal is supplied to each pixel such that pixels adjacent to each other in column and row directions have an opposite polarity to each other as shown in FIG. 11. In other words, a video signal is supplied to each pixel such that gate signal lines adjacent to each other have an opposite polarity to each other. A video signal having an opposite polarity to that of the video signal for N-th frame is supplied to each pixel of (N+1)-th frame. In other words, the polarity of a video signal supplied to each pixel is inverted every frame.

The dot inversion driving can be conducted by combining the gate line inversion driving described in Embodiment 2 and the soured line inversion driving described in Embodiment 3.

The dot inversion driving to which the present invention is applied, as described in Embodiments 2 and 3, also includes the operations of the periods 2 and 3 or the operations of the periods 5 and 6, and therefore, an amplitude width of a video signal to input to a source signal line can be made small at the time of conducting inversion driving. Accordingly, power consumption can be reduced.

Note that since pixels to which a video signal having a positive polarity is input and pixels to which a video signal having a negative polarity is input are mixed evenly in the dot inversion driving, the dot inversion driving can prevent flickers from occurring more than the source line inversion driving or the gate line inversion driving.

Embodiment 5

Embodiment 5 will describe a case where the present invention is applied to a driving method in which the gate line inversion driving and the common inversion driving are combined.

Figure 21:
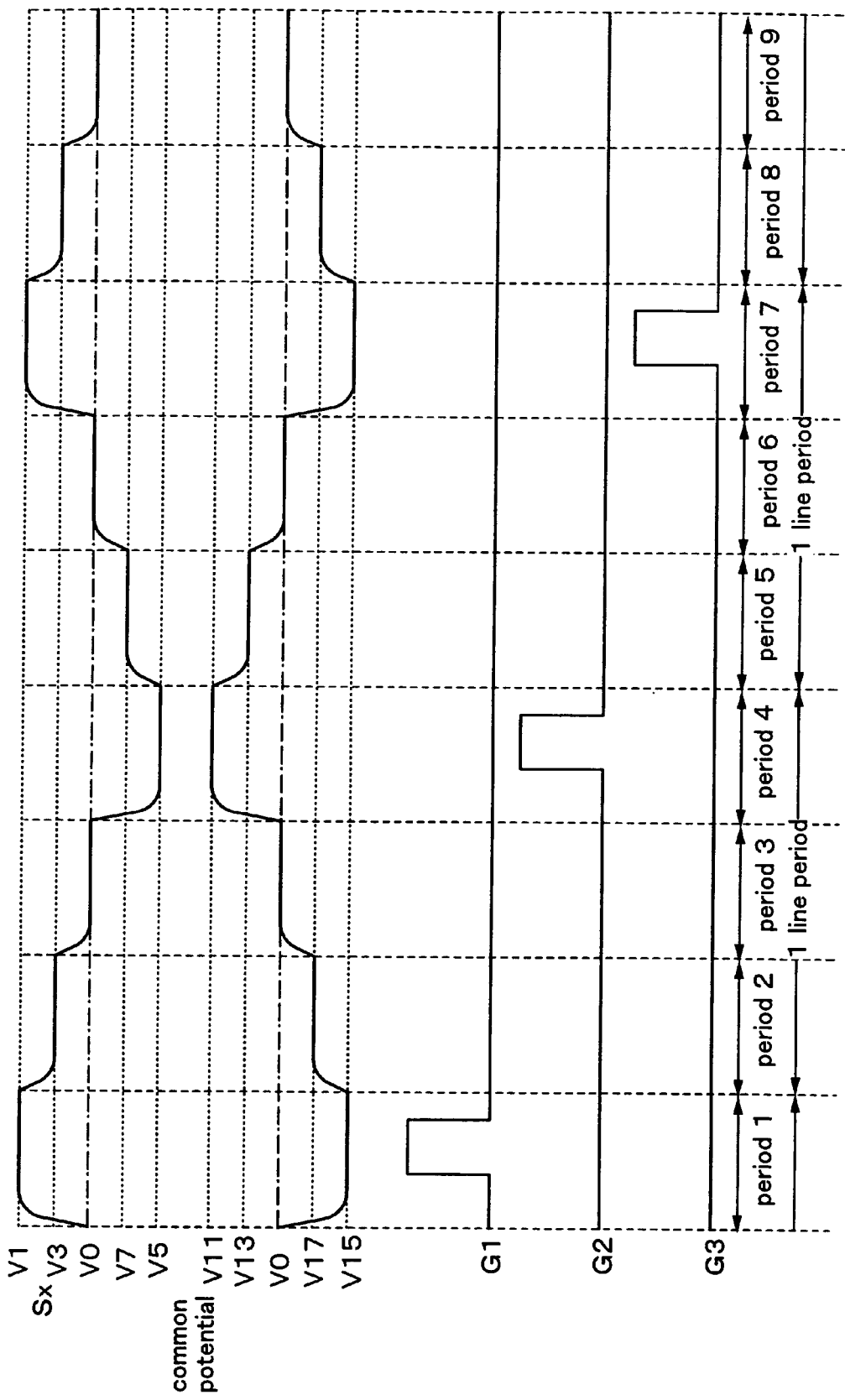
FIG. 21 shows a driving method in a case where common inversion driving and gate line inversion driving are combined.

FIG. 21 shows a timing chart in the case where the present invention is applied to a driving method in which the gate line inversion driving and the common inversion driving are combined. The case where the present invention is applied to the driving method in which the gate line inversion driving and the common inversion driving are combined is described with reference to FIG. 21. In the timing chart of FIG. 21, a chart showing a potential change of a source signal line shows a potential change of one arbitrary source signal line $S_x$ among source signal lines $S_1$ to $S_m$, and description is made of the source signal line $S_x$ below. Here, a reference potential is set to $V_0$.

First, in the period 1, the first switch and the second switch are tuned OFF. Then, a video signal having a positive potential $V_1$ is input to a source signal line $S_x$ from a first driver circuit 12 (source signal line driver circuit). Since the first switch and the second switch which are electrically connected to the source signal line $S_x$ are OFF, a potential of the source signal line $S_x$ is $V_1$.

In the period 1, a polarity of a common potential is inverted in synchronization with polarity inversion of the video signal supplied to the source signal line. At this time, the polarity of the common potential is inverted so as to be opposite to the polarity of the video signal. In other words, when the video signal has a positive potential, the common potential has a negative potential. In the period 1, the potential of the video signal supplied to the source signal line is the positive potential $V_1$, and thus, the common potential is set to be a negative potential $V_{15}$. When it is set to be $|V_1|=|V_{15}|$, as compared with a case of driving with the gate line inversion driving only, the potential of the video signal supplied to the source signal line is reduced by half. Although $V_{15}$ is set to be $|V_1|=|V_{15}|$, such value is not necessarily used.

In the period 1, a signal of ON is input to a gate signal line at a first row. Then, a thin film transistor included in a pixel which is electrically connected to the gate signal line G1 at the first row is turned ON, and a video signal is input to each pixel which is electrically connected to the gate signal line at the first row from the source signal lines $S_1$ to $S_m$. Thus, the positive potential $V_1$ is input to a pixel of the first row electrically connected to the source signal line $S_x$.

In the period 2, the first switch is turned ON. Then, since the first switch is ON, the first capacitor element is electrically connected to the source signal line $S_x$. Positive charges are stored gradually in the first capacitor element, and thus, positive voltage $V_2$ is stored in the first capacitor element and the potential of the source signal line $S_x$ becomes $V_3$. Here $V_1=V_2+V_3$.

In addition, in the period 2, the common potential is set to be a negative potential $V_{17}$. At this time, although $V_{17}$ is set so as to be $|V_{17}|=|V_3|$, such value is not necessarily used. For example, the common potential of the period 1 may be kept in the period 2 or the common potential may be set to be a reference potential $V_0$ in the period 2.

In the period 3, the first switch is turned OFF and the second switch is turned ON. Then, since the first switch is OFF, the first capacitor element is not electrically connected to the source signal line $S_x$, the positive voltage $V_2$ stored in the first capacitor element in the period 2, is still stored in the first capacitor element. Since the second switch is turned ON, the second capacitor element is electrically connected to the source signal line $S_x$, and charges corresponding to the negative voltage $V_6$ which have been stored in the second capacitor element 109 are discharged to the source signal line $S_x$. By discharging the charges, the potential of the source signal line $S_x$ becomes $V_4$. FIG. 21 shows a case where $V_4$ becomes the reference potential $V_0$; however, $V_4$ is not necessarily equal to the reference potential $V_0$. FIG. 21 shows the case of $|V_3|=|V_6|$ as an example, and thus, $V_4$ is equal to the reference potential $V_0$. However, the present invention is not limited to this case.

In the period 3, the common potential is set to be the reference potential $V_0$.

Figure 22:
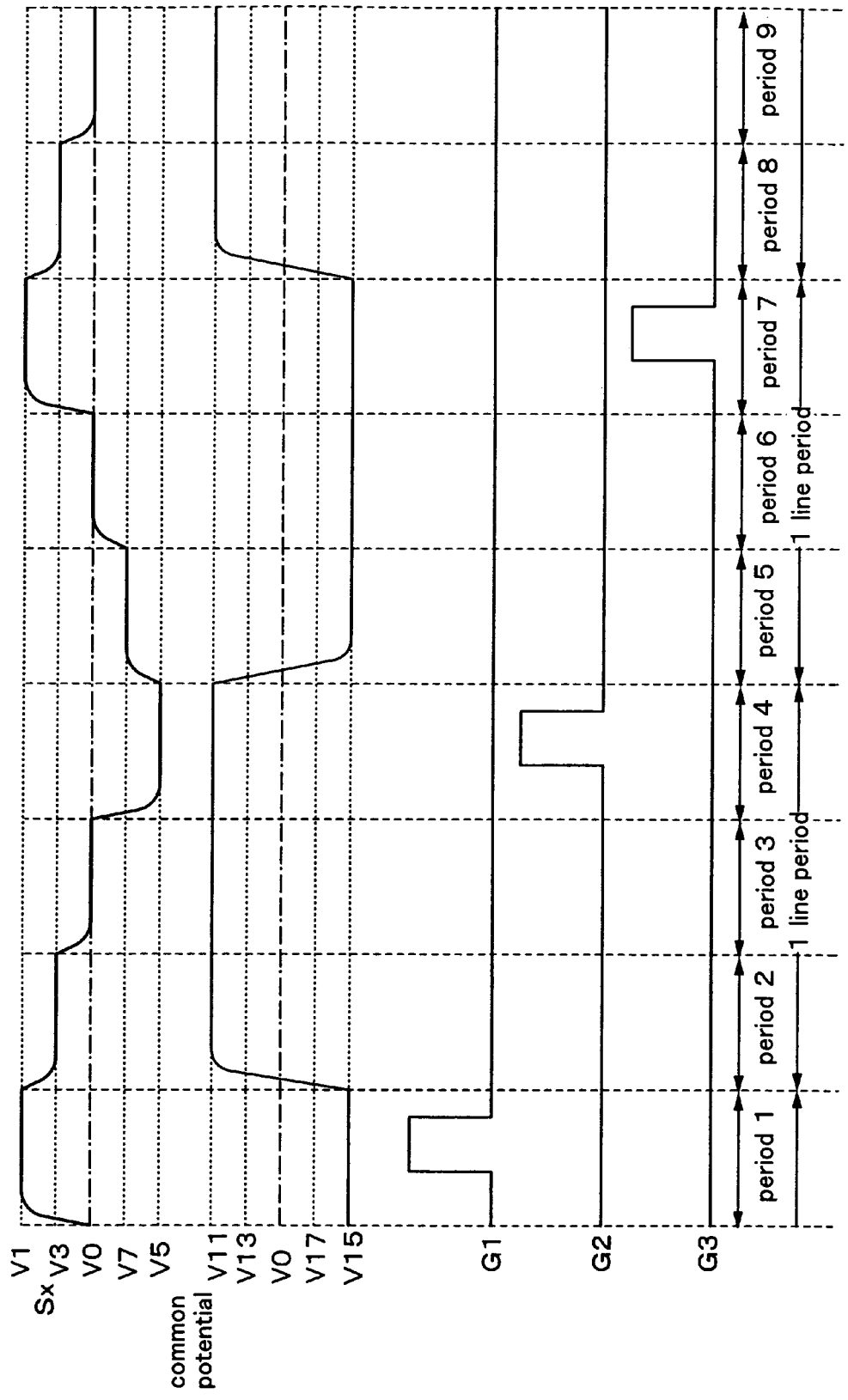
FIG. 22 shows a driving method in a case where common inversion driving and gate line inversion driving are combined.

FIG. 21 shows a case where the common potential is changed in the period 2 and the period 3; however, the present invention is not limited to this. For example, the common potential in the period 1 may be kept up to the period 3, or the common potential is changed to be equal to the reference potential $V_0$ in the period 2 and the common potential as the reference potential $V_0$ is kept at the period 3. Further, the period 2 keeps the same common potential as the period 1, and the common potential is changed to the reference potential $V_0$ in the period 3. In addition, as shown in FIG. 22, the common potential of the period 2 may be kept up to the period 4 such that the common potential becomes the common potential $V_{11}$ to be input in the period 4. When the number of changing the common potential is small, power consumption is more reduced. Therefore, the change of the common potential shown in FIG. 22 can reduce power consumption more than the change of the common potential shown in FIG. 21.

In the period 4, the second switch is turned OFF. Then, a video signal having negative potential $V_5$ is input to the source signal line $S_x$ from the first driver circuit 12 (source signal line driver circuit). Then, since the first switch and the second switch are OFF, the potential of the source signal line $S_x$ becomes $V_5$.

In the period 4, a polarity of the common potential is inverted in synchronization with polarity inversion of the video signal supplied to the source signal line. At this time, the polarity of the common potential is inverted so as to be opposite to the polarity of the video signal. In the period 4, the potential of the video signal supplied to the source signal line is the negative potential $V_5$, and thus, the common potential is set to be the positive potential $V_{11}$. When it is set to be $|V_{11}|=|V_5|$, as compared with a case of driving with gate line inversion driving only, the potential of the video signal supplied to the source signal line is reduced by half. Although $V_{11}$, is set to be $|V_{11}|=|V_5|$, such value is not necessarily used.

In the period 4, a signal of ON is input to a gate signal line $G_2$ at a second row. Then, a thin film transistor included in a pixel which is electrically connected to the gate signal line $G_2$ at the second row is turned ON, and a video signal is input to each pixel which is electrically connected to the gate signal line $G_2$ at the second row from the source signal lines $S_1$ to $S_m$. Thus, the negative potential $V_5$ is input to a pixel at the second row electrically connected to the source signal line $S_x$.

In the period 5, the second switch is turned ON. Then, since the second switch is ON, the second capacitor element is electrically connected to the source signal line $S_x$. Then, negative charges are stored gradually in the second capacitor element, and thus, negative voltage $V_6$ is stored in the second capacitor element, and the potential of the source signal line $S_x$ becomes $V_7$. Here, $V_5=V_6+V_7$.

In the period 5, the common potential is set to be positive potential $V_{13}$. Here, the potential of $V_{13}$ is set so as to be $|V_{13}|=|V_7|$; however, such value is not necessarily employed. For example, the common potential in the period 4 may be kept in the period 5 or the common potential may be set to be the reference potential $V_0$ in the period 5.

In the period 6, the first switch is turned ON and the second switch is turned OFF. Then, since the second switch is OFF, the second capacitor element is not electrically connected to the source signal line $S_x$, negative voltage $V_6$ which has been stored in the second capacitor element in the period 5 is still stored in the second capacitor element. Since the first switch is ON, the first capacitor element is electrically connected to the source signal line $S_x$, and charges corresponding to the positive voltage $V_2$ stored in the first capacitor element in the period 2 are discharged to the source signal line $S_x$. By discharging the charges, the potential of the source signal line $S_x$ becomes $V_8$. FIG. 21 shows the case where $V_8$ is a common potential; however, $V_8$ is not necessarily equal to the common potential. FIG. 21 shows a case of $|V_2|=|V_7|$ as an example, and thus, $V_8$ is equal to the common potential. However, the present invention is not limited to this case.

In the period 6, the common potential is set to be a reference potential $V_0$.

FIG. 21 shows a case where the common potential is changed in the period 5 and the period 6; however, the present invention is not limited to this. For example, the common potential in the period 4 may be kept up to the period 6, or the common potential may be set to be equal to the reference potential $V_0$ in the period 5 and the common potential as the reference potential $V_0$ is kept in the period 6. Further, the period 5 may keep the same common potential as the period 4, and the common potential may be set to be the reference potential $V_0$ in the period 6. In addition, as shown in FIG. 22, the common potential of the period 5 may be kept up to the period 7 such that the common potential becomes the common potential $V_{15}$ to be input in the period 7. When the number of changing the common potential is small, power consumption is more reduced. Therefore, the change of the common potential shown in FIG. 22 can reduce power consumption more than the change of the common potential shown in FIG. 21.

In the period 7, the first switch and the second switch are tuned OFF. Then, a video signal having a positive potential $V_1$ is input to a source signal line $S_x$ from a first driver circuit 12 (source signal line driver circuit). Since the first switch and the second switch are OFF, a potential of the source signal line $S_x$ is $V_1-V_8$ (=$V_9$). FIG. 21 shows the case of $V_9=V_1$ for simplification; however, $V_9=V_1$ is not necessarily employed.

In the period 7, the polarity of the common potential is inverted in synchronization with polarity inversion of the video signal written into the source signal line. At this time, the polarity of the common potential is inverted so as to be opposite to the polarity of the video signal. In the period 7, the potential of the video signal written into the source signal line is the positive potential $V_1$, and thus, the common potential is set to be a negative potential $V_{15}$. When it is set to be $|V_1|=|V_{15}|$, as compared with a case of driving with gate line inversion driving only, the potential of the video signal supplied to the source signal line is reduced by half. Although $V_{15}$ is set to be $|V_1|=|V_{15}|$, such value is not necessarily used.

In the period 7, a signal of ON is input to a gate signal line $G_3$ at the third row. Then, a thin film transistor included in a pixel which is electrically connected to the gate signal line $G_3$ at the third row is turned ON, and a video signal is supplied to each pixel which is electrically connected to the gate signal line $G_3$ at the third row from the source signal lines $S_1$ to $S_m$. Thus, the positive potential $V_1$ is supplied to a pixel of the third row electrically connected to the source signal line $S_x$.

In the period 8, the first switch is turned ON. Then, since the first switch is ON, the first capacitor element is electrically connected to the source signal line $S_x$. Positive charges are stored gradually in the first capacitor element, and thus, positive voltage $V_2$ is stored in the first capacitor element and the potential of the source signal line $S_x$ becomes $V_{10}$. Here, $V_9=V_2+V_{10}$. FIG. 21 shows a case of $V_{10}=V_3$ for simplification; however, the case of $V_{10}=V_3$ is not necessarily used.

In the period 9, the first switch is turned OFF and the second switch is turned ON. Then, since the first switch is OFF, the first capacitor element is not electrically connected to the source signal line $S_x$, the positive voltage $V_2$ stored in the first capacitor element in the period 8, is still stored in the first capacitor element. Since the second switch is turned ON, the second capacitor element is electrically connected to the source signal line $S_x$, and charges corresponding to negative voltage $V_6$ which have been stored in the second capacitor element in the period 5 are discharged to the source signal line $S_x$. By discharging the charges, the potential of the source signal line $S_x$ becomes $V_{11}$. FIG. 21 shows a case where $V_{11}$ or $V_4$ becomes a common potential; however, $V_{11}$ or $V_4$ is not necessarily equal to the common potential. FIG. 21 shows the case of $|V_{10}|=|V_6|$ as an example, and thus, $V_{11}$ is equal to the common potential. However, the present invention is not limited to this case.

The potential change of a video signal supplied to a source signal and the change of the common potential are repeated with the periods 1 to 6 as one cycle. Thus, in FIG. 21, the potential change of the video signal supplied to the source signal line and the change of the common potential in the periods 7, 8 and 9 are the same as the potential change of the video signal supplied to the source signal line and the change of the common potential in the periods 1, 2 and 3.

The above description has explained the case of a model screen having display pixels with three rows×four columns for simplification, and thus, writing is conducted for pixels at up to the third row. However, the same operation can be conduced in display pixels of n rows×m columns, in addition to the case of n=3 and m=4.

In the case of the display pixels of n rows×m columns, the same operations as the potential of the video signal and the common potential in the periods 1 to 6 may be repeated in order to complete writing up to the n-th row.

As described above, the driving method in which the gate line inversion driving and the common inversion driving are combined and to which the present invention is applied, also includes the operations of the periods 2 and 3 or the operations of the periods 5 and 6, and therefore, an amplitude width of a video signal to be input to a source signal line can be made small at the time of conducting the inversion driving. Accordingly, power consumption can be reduced.

Embodiment 6

Embodiment 6 will describe a layout of a first switch and a first capacitor element. In this embodiment, the display device including the first switch formed from a CMOS circuit is described as an example.

Figure 23A:
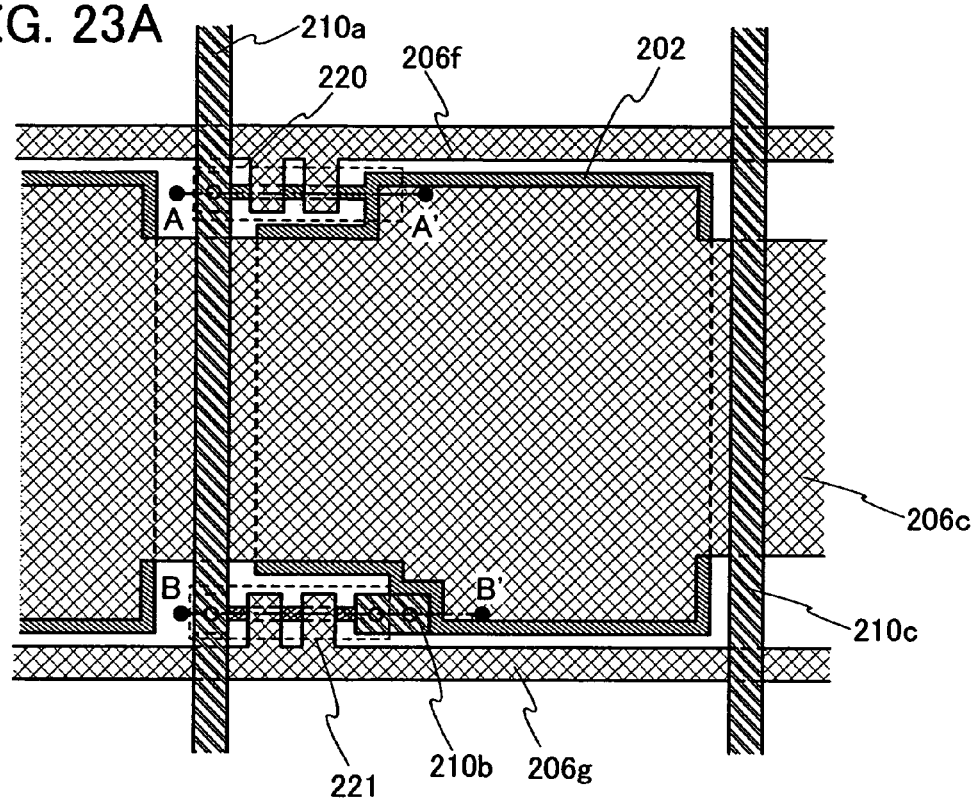
FIGS. 23A to 23C show layout of a first switch and a first capacitor element.
Figure 23B:
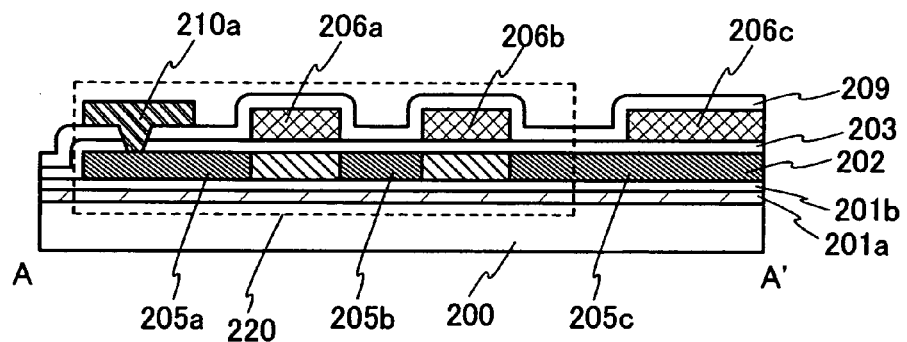
Figure 23C:
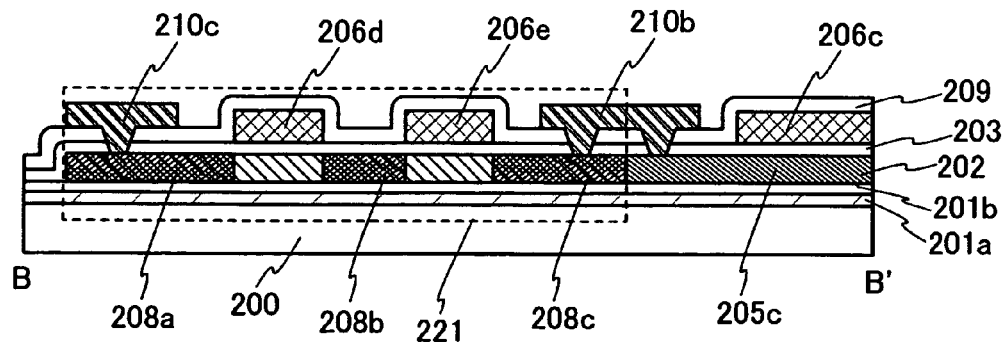

FIG. 23A is a top view showing a layout in a region A shown in FIG. 15. FIG. 23B shows a cross section along A-A' of FIG. 23A, and FIG. 23C shows a cross section along B-B' of FIG. 23A, In FIGS. 23A to 23C, reference numeral 220 denotes an N-channel thin film transistor (N-channel TFT) constituting a part of a first CMOS circuit 36, and reference numeral 221 denotes a P-channel thin film transistor (P-channel TFT) constituting a part of the first CMOS circuit 36. FIGS. 23A to 23C show a case that the N-channel type TFT and the P-channel type TFT constituting a first switch are both a double gate type TFT having two gate electrodes; however the present invention is not limited to this structure. A TFT having a single gate structure with one gate electrode or a TFT having two or more gate electrodes may be used. A normal TFT such as a TFT having an offset region or a TFT having an LDD region may be used instead.

In FIG. 23A, in a region in which a semiconductor film 202 is overlapped with a second electrode 206c of a capacitor element, the capacitor element is formed. A region of the semiconductor film 202 which is overlapped with the second electrode 206c of the capacitor element serves a first electrode of the capacitor element. The second electrode 206c of the capacitor element is formed from the same metal film as gate wires 206f and 206g. A first gate electrode 206a and a second gate electrode 206b of the N-channel TFT 220 are formed from an extended portion of a gate wire 206f. A third gate electrode 206d and a fourth gate electrode 206e of the P-channel TFT 221 are formed from an extended portion of the gate wire 206g.

With reference to FIG. 23B, a cross sectional structure in a region where the N-channel TFT 220 and the capacitor element are formed, i.e., the cross sectional structure taken along A-A', is described. A base film having a stacked structure of a silicon nitride film 201a and a silicon oxide film 201b is formed over the substrate 200, and a semiconductor film 202 is formed over the base film. The semiconductor film includes a first N-type impurity region 205a, a second N-type impurity region 205b, a third N-type impurity region 205c, a first intrinsic region formed between the first N-type impurity region 205a and the second N-type impurity region 205b, and a second intrinsic region formed between the second N-type impurity region 205b and the third N-type impurity region 205c. A part of the third N-type impurity region 205c serves as the first electrode of the capacitor element.

A gate insulating film 203 is formed over the semiconductor film 202. A first gate electrode 206a, a second gate electrode 206b, and a second electrode 206c of the capacitor element are formed over the gate insulting film 203. The capacitor element is formed from a part of the third N-type impurity region 205c, the gate insulating film 203 and the second electrode 206c of the capacitor element.

An interlayer insulating film 209 is formed over the gate insulating film 203, the first gate electrode 206a, the second gate electrode 206b, and the second electrode 206c of the capacitor element, and a source signal line 210a is formed over the interlayer insulating film 209. The source signal line 210a is electrically connected to the first N-type impurity region 205a of the N-channel TFT 220.

Next, with reference to FIG. 23C, a cross sectional structure in a region where the P-channel TFT 221 and the capacitor element are formed, i.e., the cross sectional structure taken along B-B', is described. A base film having a stacked structure of a silicon nitride film 201a and a silicon oxide film 201b is formed over the substrate 200, and a semiconductor film 202 is formed over the base film. The semiconductor film includes a first P-type impurity region 208a, a second P-type impurity region 208b, a third P-type impurity region 208c, a third N-type impurity region 205c, a third intrinsic region formed between the first P-type impurity region 208a and the second P-type impurity region 208b, and a fourth intrinsic region formed between the second P-type impurity region 208b and the third P-type impurity region 208c. A part of the third N-type impurity region 205c serves as the first electrode of the capacitor element.

Then, a gate insulating film 203 is formed over the semiconductor film 202. A third gate electrode 206d, a fourth gate electrode 206e, and a second electrode 206c of the capacitor element are formed over the gate insulting film 203. The capacitor element is formed from a part of the third N-type impurity region 205c, the gate insulating film 203 and the second electrode 206c of the capacitor element.

The interlayer insulating film 209 is formed over the gate insulating film 203, the third gate electrode 206d, the fourth gate electrode 206e, and the second electrode 206c of the capacitor element, and a source signal line 210c is formed over the interlayer insulating film 209. The source signal line 210c is electrically connected to the first P-type impurity region 208a of the P-channel TFT 221.

A manufacturing process of the first switch and the first capacitor element which are laid out as described above is described with reference to FIGS. 24 to 26.

Figure 25A:
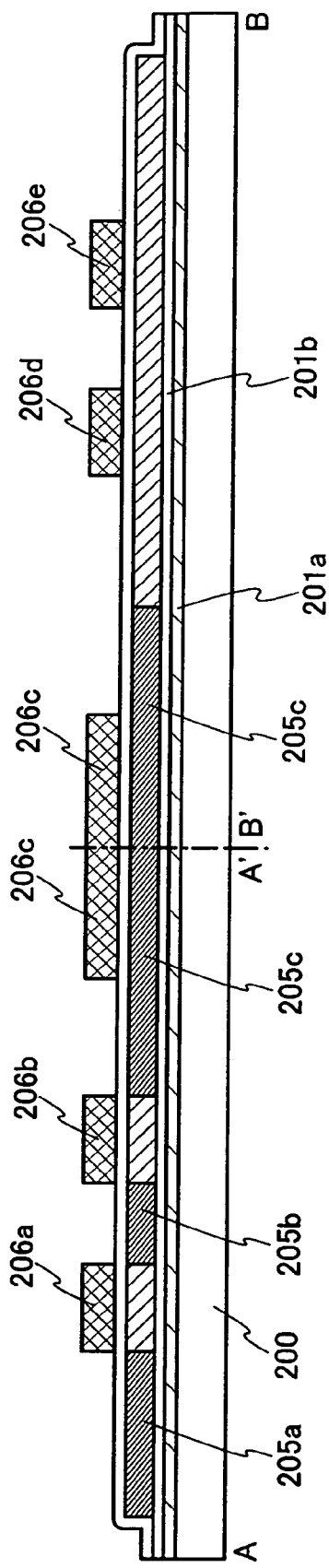
FIGS. 25A and 25B show a manufacturing process of the first switch and the first capacitor element.
Figure 25B:
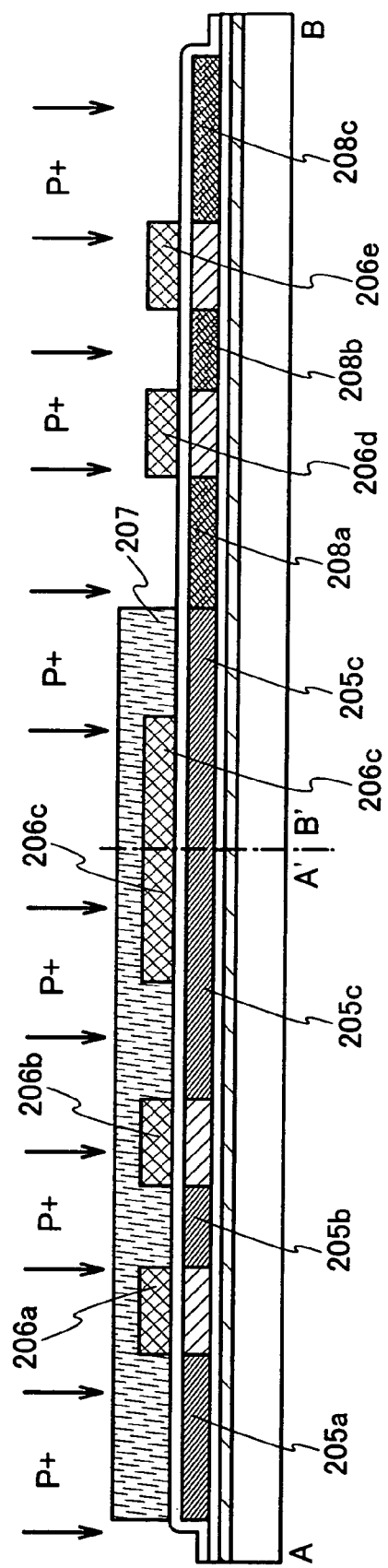
Figure 26:
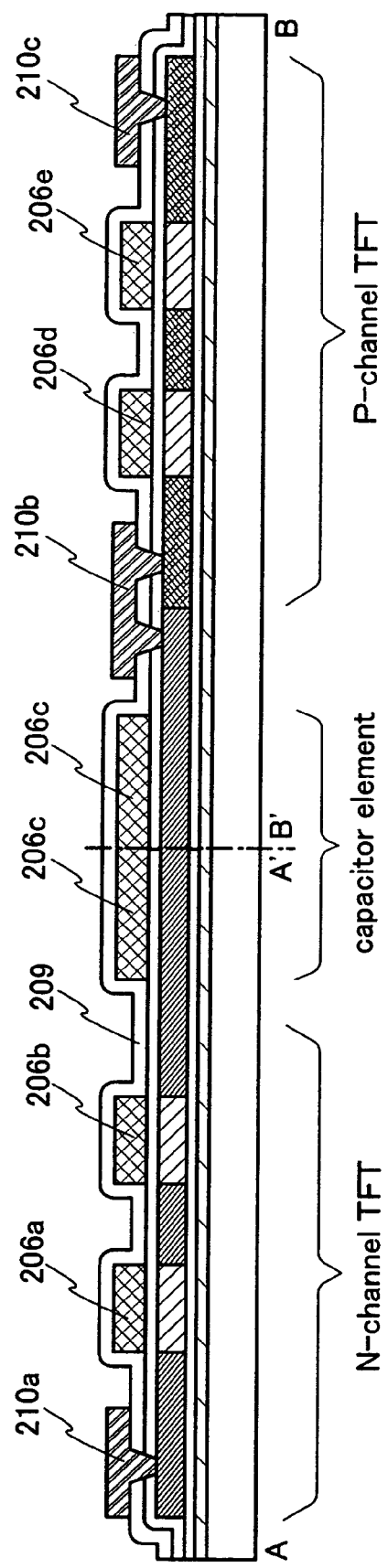
FIG. 26 shows a manufacturing process of the first switch and the first capacitor element.

In FIGS. 24 to 26, the left part of each drawing shows the cross section taken along A-A' in FIGS. 23A to 23C, while the right part of each drawing shows the cross section taken along B-B' in FIGS. 23A to 23C.

Figure 24A:
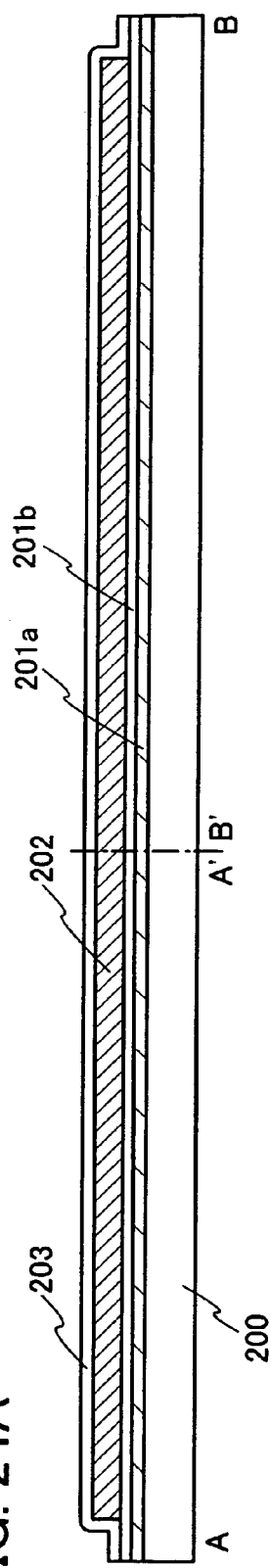
FIGS. 24A and 24B show a manufacturing process of the first switch and the first capacitor element.

As shown in FIG. 24A, the base film is formed on substrate 200. At this time, as the base film, a stacked film including a silicon nitride film 201a and a silicon oxide film 201b is formed by a plasma CVD method, a sputtering method or the like; the present invention is not limited to this. A film including silicon oxide, a film including silicon oxynitride film, or a film including silicon nitride oxide may be formed as a single layer structure or the films may be stacked as appropriate. The semiconductor film 202 is formed over the silicon oxide film 201b constituting a part of the base film. Here, a silicon film is formed as the semiconductor film 202. The silicon film may be an amorphous silicon film or a crystalline silicon film. A gate insulating film 203 covering the semiconductor film 202 is formed. The gate insulating film 203 is formed from a film including silicon oxide or silicon nitride as a single layer or a stacked layer by a sputtering method or a CVD method such as plasma CVD. Specifically, a film including silicon oxide, a film including silicon oxynitride film, or a film including silicon nitride oxide may be formed as a single layer structure or the films may be stacked as appropriate.

Figure 24B:
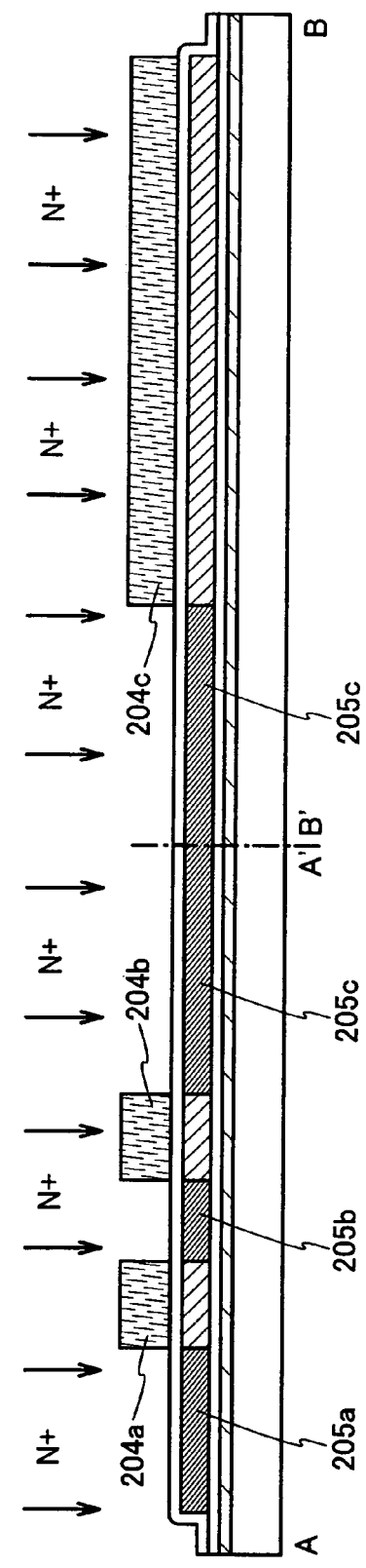

As shown in FIG. 24B, masks 204a, 204b and 204c are formed. An impurity element having an N-type conductivity is added to the semiconductor film 202 by doping from above the masks 204a, 204b and 204c and the gate insulating film 203. By this doping, in a region in which the masks 204a, 204b and 204c are not formed, a first N-type impurity region 205a, a second N-type impurity region 205b, and a third N-type impurity region 205c are formed.

As shown in FIG. 25A, a first gate electrode 206a, a second gate electrode 206b, a metal film 206c which becomes one electrode of the capacitor element, a third gate electrode 206d, and a fourth gate electrode 206e are formed.

Here, in FIG. 25A, the first gate electrode 206a is formed so as to have a width which is equal to that of the first intrinsic region between the first N-type impurity region 205a and the second N-type impurity region 205b; however, the first gate electrode 206a may be formed so as to have a width which is shorter than that of the first intrinsic region between the first N-type impurity region 205a and the second N-type impurity region 205b. In this case, an offset region can be formed between the first N-type impurity region 205a and the first intrinsic region and between the first intrinsic region and the second N-type impurity region 205b, respectively.

In addition, the second gate electrode 206b is formed so as to have a width which is equal to that of the second intrinsic region between the second N-type impurity region 205b and the third N-type impurity region 205c; however, the second gate electrode 206b may be formed so as to have a width which is shorter than that of the second intrinsic region between the second N-type impurity region 205b and the third N-type impurity region 205c. In this case, an offset region can be formed between the second N-type impurity region 205b and the second intrinsic region and between the second intrinsic region and the third N-type impurity region 205c, respectively.

Then, as shown in FIG. 25B, a region which is to serve as a P-channel type thin film transistor (P-channel TFT) later is exposed, and a mask 207 is formed in the other region. An impurity element having a P-type conductivity is added to the semiconductor film 202 by doping from above the mask 207 and the gate insulating film 203. By this doping, in a region in which the mask 207, the third gate electrode 206d, and the fourth gate electrode 206e are not formed, a first P-type impurity region 208a, a second P-type impurity region 208b, and a third P-type impurity region 208c are formed.

As shown in FIG. 26, an interlayer insulating film 209 is formed over the gate insulating film 203, the first gate electrode 206a, the second gate electrode 206b, the metal film 206c serving as one electrode of the capacitor element, the third gate electrode 206d, and the fourth gate electrode 206e. Source signal lines 210a, 210c and an electrode 210b are formed over the interlayer insulating film 209.

The source signal line 210a is electrically connected to the first N-type impurity region 205a, and the source signal line 210c is electrically connected to the third P-type impurity region 208c. The electrode 210b electrically connects the third N-type impurity region 205c to the first P-type impurity region 208a.

As described above, the N-channel thin film transistor (N-channel TFT) and the P-channel thin film transistor (P-channel TFT) constituting the first switch and the capacitor element can be formed.

In the manufacturing process described above, only the first CMOS circuit 36 and the first capacitor element 17 are described; however, the second CMOS circuit 38 and the second capacitor element 19 may be formed in the same manner as the first CMOS circuit 36 and the first capacitor element 17.

Embodiment 7

The above description has explained the case that the present invention is applied to a liquid crystal; however, the present invention can be applied to an EL display device.

In the EL display device, a light-emitting element is driven by inversion driving in order to lengthen the lifetime of the light-emitting element, in particular, an organic EL element. The present invention can be applied to this case.

Note that the inversion driving of the light-emitting element has a longer cycle of inversion polarity of a video signal than inversion driving of a liquid crystal display device, and thus, the inversion frequency is less. Thus, the advantageous effect of lowering power consumption can be obtained more easily when the present invention is applied to inversion driving of a liquid crystal display device than when the present invention is applied to inversion driving of a light-emitting element.

Further, the present invention can be applied to a case where an inorganic EL is driven by AC driving.

Embodiment 8

Electronic devices using a display device of the present invention will be described with reference to FIGS. 27A to 27E. As examples of electronic devices in accordance with the present invention, there are given cameras such as video cameras and digital cameras, goggle type displays (head mounted displays), navigation systems, audio reproducing devices (car audio components, MP3 players and the like), computers, game machines, portable information terminals (e.g., mobile computers, mobile phones, portable game machines, electronic dictionaries, electronic books, and the like), image reproducing devices equipped with a recording medium (specifically, devices having a display that can reproduce content of a recording medium such as a digital versatile disc (DVD) and can display an image thereof).

Figure 27A:
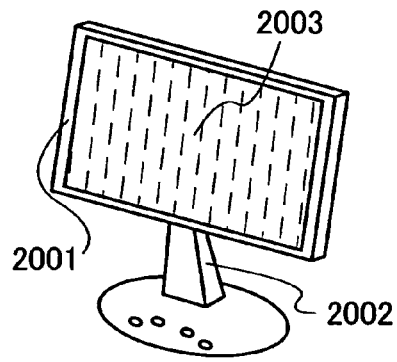
FIGS. 27A to 27E each show an electronic device to which a display device of the present invention is applied.

FIG. 27A shows a display device, which corresponds to a monitor for a personal computer, a television receiver, or the like. The display device includes a casing 2001, a support 2002, a display portion 2003, and the like. In accordance with the present invention, a display device of which power consumption is reduced can be manufactured.

Figure 27B:
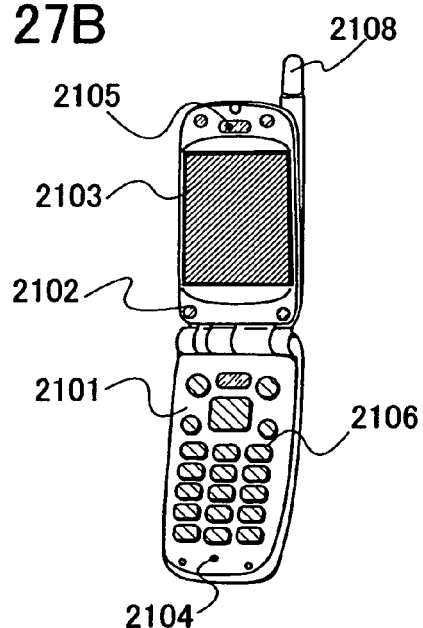

FIG. 27B shows a mobile phone by which people can watch TV, including a main body 2101, a casing 2102, a display portion 2103, an audio input portion 2104, an audio output portion 2105, operation keys 2106, an antenna 2108, and the like. In accordance with the present invention, a display device of which power consumption is reduced can be manufactured.

Figure 27C:
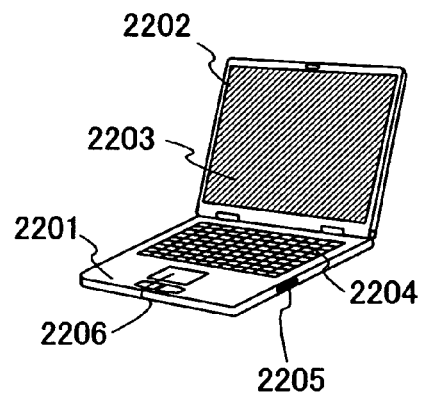

FIG. 27C shows a computer, including a main body 2201, a casing 2202, a display portion 2203, a keyboard 2204, an external connection port 2205, a pointing mouse 2206, and the like. In accordance with the present invention, a computer in which of which power consumption is reduced can be manufactured. Although FIG. 27C shows a laptop type computer as an example, the present invention can be applied to a desk top type computer unified with a monitor, and the like.

Figure 27D:
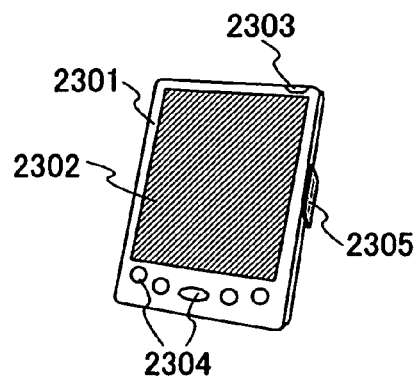

FIG. 27D shows a mobile computer, including a main body 2301, a display portion 2302, a switch 2303, operation keys 2304, an infrared port 2305, and the like. In accordance with the present invention, a mobile computer of which power consumption is reduced can be manufactured.

Figure 27E:
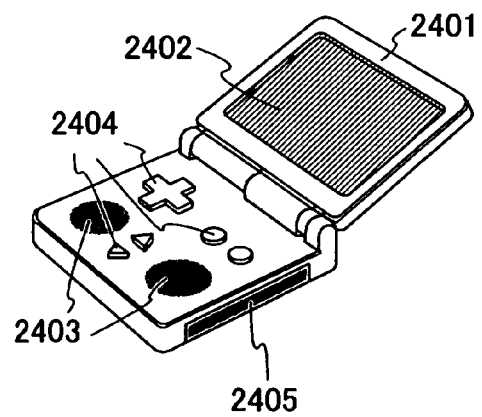

FIG. 27E shows a portable game machine, including a casing 2401, a display portion 2402, speaker portions 2403, operation keys 2404, a recording medium insertion portion 2405, and the like. In accordance with the present invention, a game machine of which power consumption is reduced can be manufactured.

As described above, the range of application of the present invention is extremely wide and the present invention can be used for electronic devices in all kinds of fields.

This embodiment can be freely combined with any of Embodiment Mode and Embodiments 1 to 5.

The present application is based on Japanese Patent application No. 2005-349889 filed on Dec. 2, 2005 in the Japanese Patent Office, the entire contents of which are hereby incorporated by reference.

What is claimed is:
1. A display device comprising:
a first wire to which a first video signal is input;
a source signal line driver circuit electrically connected to the first wire; and
a first region and a second region which is adjacent to the first region,
wherein the first region comprises:
a first capacitor element;
a second capacitor element;
a first switch controlling conduction or non conduction between the first wire and a first electrode of the first capacitor element; and a second switch controlling conduction or non conduction between the first wire and a first electrode of the second capacitor element,
wherein a second electrode of the first capacitor element is electrically connected to a second electrode of the second capacitor element,
wherein the first switch is directly connected to the second switch,
wherein the second region comprises a first pixel directly connected to the first wire,
wherein each of the first switch and the second switch comprises an n-channel transistor and a p-channel transistor,
wherein the n-channel transistor comprises:
  a first semiconductor layer including a first n-type region, a second n-type region, and a first channel formation region interposed between the first n-type region and the second n-type region;
  an insulating layer over the first semiconductor layer; and
  a first gate electrode over the insulating layer, the first gate electrode overlapping with the first channel formation region,
wherein the p-channel transistor comprises:
  a second semiconductor layer including a first p-type region, a second p-type region, and a second channel formation region interposed between the first p-type region and the second p-type region;
  the insulating layer over the second semiconductor layer; and
  a second gate electrode over the insulating layer, the second gate electrode overlapping with the second channel formation region,
wherein the insulating layer has a first opening overlapping with the second n-type region and a second opening overlapping with the second p-type region,
wherein the first wire is electrically connected to the first n-type region and the first p-type region,
wherein the second n-type region is directly connected to the second p-type region,
wherein the second n-type region is electrically connected to the second p-type region through a metal layer formed in the first opening and the second opening,
wherein a part of the second n-type region of the first switch is the first electrode of the first capacitor element,
wherein a part of the second n-type region of the second switch is the first electrode of the second capacitor element, and
wherein the first capacitor element and the second capacitor element are connected in turn to the first wire during a period from completing input of a first signal to a first gate signal line to starting input of a second signal to a second gate signal line.

2. The display device according to claim 1, wherein the display device is a liquid crystal display device.

3. An electronic device including the display device according to claim 1.

4. The display device according to claim 1, wherein the first video signal is input to the first wire from the source signal line driver circuit.

5. The display device according to claim 1, wherein a driver circuit which controls the first switch and the second switch is different from a driver circuit which controls a transistor in the first pixel.

6. A display device comprising:
a first wire to which a first video signal is input;
a source signal line driver circuit electrically connected to the first wire; and
a first region and a second region which is adjacent to the first region,
wherein the first region comprises:
  a first capacitor element configured to supply positive charges;
  a second capacitor element configured to supply negative charges;
  a first switch controlling conduction or non conduction between the first wire and a first electrode of the first capacitor element; and
    a second switch controlling conduction or non conduction between the first wire and a first electrode of the second capacitor element,
wherein a second electrode of the first capacitor element is electrically connected to a second electrode of the second capacitor element,
wherein the first switch is directly connected to the second switch,
wherein the second region comprises a first pixel directly connected to the first wire,
wherein each of the first switch and the second switch comprises an n-channel transistor and a p-channel transistor,
wherein the n-channel transistor comprises:
  a first semiconductor layer including a first n-type region, a second n-type region, and a first channel formation region interposed between the first n-type region and the second n-type region;
  an insulating layer over the first semiconductor layer; and
  a first gate electrode over the insulating layer, the first gate electrode overlapping with the first channel formation region,
wherein the p-channel transistor comprises:
  a second semiconductor layer including a first p-type region, a second p-type region, and a second channel formation region interposed between the first p-type region and the second p-type region;
  the insulating layer over the second semiconductor layer; and
  a second gate electrode over the insulating layer, the second gate electrode overlapping with the second channel formation region,
wherein the insulating layer has a first opening overlapping with the second n-type region and a second opening overlapping with the second p-type region,
wherein the first wire is electrically connected to the first n-type region and the first p-type region,
wherein the second n-type region is directly connected to the second p-type region,
wherein the second n-type region is electrically connected to the second p-type region through a metal layer formed in the first opening and the second opening,
wherein a part of the second n-type region of the first switch is the first electrode of the first capacitor element,
wherein a part of the second n-type region of the second switch is the first electrode of the second capacitor element, and
  wherein the first capacitor element and the second capacitor element are connected in turn to the first wire during a period from completing input of a first signal to a first gate signal line to starting input of a second signal to a second gate signal line.

7. The display device according to claim 6, wherein the display device is a liquid crystal display device.

8. An electronic device including the display device according to claim 6.

9. The display device according to claim 6, wherein the first video signal is input to the first wire from the source signal line driver circuit.

10. The display device according to claim 6, wherein a driver circuit which controls the first switch and the second switch is different from a driver circuit which controls a transistor in the first pixel.

11. A display device comprising:
a first wire to which a first video signal is input;
a source signal line driver circuit electrically connected to the first wire; and
a first region and a second region which is adjacent to the first region,
wherein the first region comprises:
a first switch and a second switch, one terminal of each of the first switch and the second switch being electrically connected to the first wire;
a first capacitor element, wherein a first electrode of the first capacitor element is electrically connected to the other terminal of the first switch; and
a second capacitor element, wherein a first electrode of the second capacitor element is electrically connected to the other terminal of the second switch,
wherein a second electrode of the first capacitor element is electrically connected to a second electrode of the second capacitor element,
wherein the one terminal of the first switch is directly connected to the one terminal of the second switch,
wherein the second region comprises a first pixel directly connected to the first wire,
wherein each of the first switch and the second switch comprises an n-channel transistor and a p-channel transistor,
wherein the n-channel transistor comprises:
a first semiconductor layer including a first n-type region, a second n-type region, and a first channel formation region interposed between the first n-type region and the second n-type region;
an insulating layer over the first semiconductor layer; and
a first gate electrode over the insulating layer, the first gate electrode overlapping with the first channel formation region,
wherein the p-channel transistor comprises:
a second semiconductor layer including a first p-type region, a second p-type region, and a second channel formation region interposed between the first p-type region and the second p-type region;
the insulating layer over the second semiconductor layer; and
a second gate electrode over the insulating layer, the second gate electrode overlapping with the second channel formation region,
wherein the insulating layer has a first opening overlapping with the second n-type region and a second opening overlapping with the second p-type region,
wherein the first wire is electrically connected to the first n-type region and the first p-type region,
wherein the second n-type region is directly connected to the second p-type region,
wherein the second n-type region is electrically connected to the second p-type region through a metal layer formed in the first opening and the second opening,
wherein a part of the second n-type region of the first switch is the first electrode of the first capacitor element,
wherein a part of the second n-type region of the second switch is the first electrode of the second capacitor element, and
wherein the first capacitor element and the second capacitor element are connected in turn to the first wire during a period from completing input of a first signal to a first gate signal line to starting input of a second signal to a second gate signal line.

12. The display device according to claim 11, wherein the display device is a liquid crystal display device.

13. An electronic device including the display device according to claim 11.

14. The display device according to claim 11, wherein the first video signal is input to the first wire from the source signal line driver circuit.

15. The display device according to claim 11, wherein a driver circuit which controls the first switch and the second switch is different from a driver circuit which controls a transistor in the first pixel.

16. A display device comprising:
a first wire to which a first video signal is input;
a source signal line driver circuit electrically connected to the first wire; and
a first region and a second region which is adjacent to the first region,
wherein the first region comprises:
a first switch and a second switch, one terminal of each of the first switch and the second switch being electrically connected to the first wire;
a first capacitor element, wherein a first electrode of the first capacitor element is electrically connected to the other terminal of the first switch and wherein the first electrode of the first capacitor element is configured to store positive charges; and
a second capacitor element, wherein a first electrode of the second capacitor element is electrically connected to the other terminal of the second switch and wherein the first electrode of the second capacitor element is configured to store negative charges,
wherein a second electrode of the first capacitor element is electrically connected to a second electrode of the second capacitor element,
wherein the one terminal of the first switch is directly connected to the one terminal of the second switch,
wherein the second region comprises a first pixel directly connected to the first wire,
wherein each of the first switch and the second switch comprises an n-channel transistor and a p-channel transistor,
wherein the n-channel transistor comprises:
a first semiconductor layer including a first n-type region, a second n-type region, and a first channel formation region interposed between the first n-type region and the second n-type region;
an insulating layer over the first semiconductor layer; and
a first gate electrode over the insulating layer, the first gate electrode overlapping with the first channel formation region,
wherein the p-channel transistor comprises:
a second semiconductor layer including a first p-type region, a second p-type region, and a second channel formation region interposed between the first p-type region and the second p-type region;
the insulating layer over the second semiconductor layer; and a second gate electrode over the insulating layer, the second gate electrode overlapping with the second channel formation region,
wherein the insulating layer has a first opening overlapping with the second n-type region and a second opening overlapping with the second p-type region,
wherein the first wire is electrically connected to the first n-type region and the first p-type region,
wherein the second n-type region is directly connected to the second p-type region,
wherein the second n-type region is electrically connected to the second p-type region through a metal layer formed in the first opening and the second opening,
wherein a part of the second n-type region of the first switch is the first electrode of the first capacitor element,
wherein a part of the second n-type region of the second switch is the first electrode of the second capacitor element, and
wherein the first capacitor element and the second capacitor element are connected in turn to the first wire during a period from completing input of a first signal to a first gate signal line to starting input of a second signal to a second gate signal line.

17. The display device according to claim 16, wherein the display device is a liquid crystal display device.

18. An electronic device including the display device according to claim 16.

19. The display device according to claim 16, wherein the first video signal is input to the first wire from the source signal line driver circuit.

20. The display device according to claim 16, wherein a driver circuit which controls the first switch and the second switch is different from a driver circuit which controls a transistor in the first pixel.

21. The display device according to claim 1, wherein the second region is between the source signal line driver circuit and the first region.

22. The display device according to claim 6, wherein the second region is between the source signal line driver circuit and the first region.

23. The display device according to claim 11, wherein the second region is between the source signal line driver circuit and the first region.

24. The display device according to claim 16, wherein the second region is between the source signal line driver circuit and the first region.

25. The display device according to claim 1, further comprising:
a second wire to which a second video signal is input,
wherein the source signal line driver circuit electrically connected to the second wire,
wherein the first region further comprises:
a third capacitor element;
a fourth capacitor element;
a third switch controlling conduction or non conduction between the second wire and a first electrode of the third capacitor element; and
a fourth switch controlling conduction or non conduction between the second wire and a first electrode of the fourth capacitor element,
wherein a second electrode of the third capacitor element is electrically connected to a second electrode of the fourth capacitor element,
wherein the third switch is directly connected to the fourth switch, and
wherein the second region further comprises a second pixel directly connected to the second wire.

26. The display device according to claim 6, further comprising:
a second wire to which a second video signal is input,
wherein the source signal line driver circuit electrically connected to the second wire,
wherein the first region further comprises:
a third capacitor element configured to supply positive charges;
a fourth capacitor element configured to supply negative charges;
a third switch controlling conduction or non conduction between the second wire and a first electrode of the third capacitor element; and
a fourth switch controlling conduction or non conduction between the second wire and a first electrode of the fourth capacitor element,
wherein a second electrode of the third capacitor element is electrically connected to a second electrode of the fourth capacitor element,
wherein the third switch is directly connected to the fourth switch, and
wherein the second region further comprises a second pixel directly connected to the second wire.

27. The display device according to claim 11, further comprising:
a second wire to which a second video signal is input,
wherein the source signal line driver circuit electrically connected to the second wire;
wherein the first region further comprises:
a third switch and a fourth switch, one terminal of each of the third switch and the fourth switch being electrically connected to the second wire;
a third capacitor element, wherein a first electrode of the third capacitor element is electrically connected to the other terminal of the third switch; and
a fourth capacitor element, wherein a first electrode of the fourth capacitor element is electrically connected to the other terminal of the fourth switch,
wherein a second electrode of the third capacitor element is electrically connected to a second electrode of the fourth capacitor element,
wherein the one terminal of the third switch is directly connected to the one terminal of the fourth switch,
wherein the second region further comprises a second pixel directly connected to the second wire.

28. The display device according to claim 16, further comprising:
a second wire to which a second video signal is input,
wherein the source signal line driver circuit electrically connected to the second wire,
wherein the first region further comprises:
a third switch and a fourth switch, one terminal of each of the third switch and the fourth switch being electrically connected to the second wire;
a third capacitor element, wherein a first electrode of the third capacitor element is electrically connected to the other terminal of the third switch and wherein the first electrode of the third capacitor element is configured to store positive charges; and
a fourth capacitor element, wherein a first electrode of the fourth capacitor element is electrically connected to the other terminal of the fourth switch and wherein the first electrode of the fourth capacitor element is configured to store positive charges,
wherein a second electrode of the third capacitor element is electrically connected to a second electrode of the fourth capacitor element, wherein the one terminal of the third switch is directly connected to the one terminal of the fourth switch, and wherein the second region further comprises a second pixel directly connected to the second wire.

* * * * *